United States Patent
Dougakiuchi et al.

(10) Patent No.: US 12,520,615 B2
(45) Date of Patent: Jan. 6, 2026

(54) LIGHT DETECTION MODULE AND BEAT SPECTROMETER

(71) Applicant: HAMAMATSU PHOTONICS K.K., Hamamatsu (JP)

(72) Inventors: Tatsuo Dougakiuchi, Hamamatsu (JP); Akio Ito, Hamamatsu (JP); Masahiro Hitaka, Hamamatsu (JP); Tadataka Edamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 440 days.

(21) Appl. No.: 18/023,435

(22) PCT Filed: May 26, 2021

(86) PCT No.: PCT/JP2021/020057
§ 371 (c)(1),
(2) Date: Feb. 27, 2023

(87) PCT Pub. No.: WO2022/059261
PCT Pub. Date: Mar. 24, 2022

(65) Prior Publication Data
US 2023/0317867 A1    Oct. 5, 2023

(30) Foreign Application Priority Data
Sep. 16, 2020   (JP) .................................. 2020-155515

(51) Int. Cl.
*H10F 77/14*   (2025.01)
*G01J 3/10*    (2006.01)
(Continued)

(52) U.S. Cl.
CPC ............. *H10F 77/146* (2025.01); *G01J 3/10* (2013.01); *G01J 3/45* (2013.01); *G01J 3/457* (2013.01);
(Continued)

(58) Field of Classification Search
CPC .................................................. H10F 77/147
See application file for complete search history.

(56) References Cited

U.S. PATENT DOCUMENTS 6,897,471 B1    5/2005 Soref et al.
2001/0030330 A1*  10/2001 Inomoto ............... H10F 77/147
                                                    257/E31.059

(Continued)

FOREIGN PATENT DOCUMENTS

CN    102473790 A    5/2012
EP      0437836 A2   7/1991
(Continued)

OTHER PUBLICATIONS

International Preliminary Report on Patentability mailed Mar. 30, 2023 for PCT/JP2021/020057.
(Continued)

*Primary Examiner* — Evren Seven
(74) *Attorney, Agent, or Firm* — Faegre Drinker Biddle & Reath LLP

(57) ABSTRACT

A photodetection module includes a photodetector and a fixing member. The photodetector includes a semiconductor substrate, a mesa portion, a first contact layer, a second contact layer, and a first electrode formed in a planar shape on a major surface of the semiconductor substrate, and electrically connected to one of the first contact layer and the second contact layer. The fixing member includes an insulating substrate, and a first wiring formed in a planar shape on a major surface of the insulating substrate. A recessed portion is formed in the major surface of the insulating substrate, and at least a part of the mesa portion is disposed inside the recessed portion. The first electrode is electrically connected to the first wiring in a state where the first electrode is in surface contact with the first wiring.

17 Claims, 25 Drawing Sheets

(51) Int. Cl.
  *G01J 3/45* (2006.01)
  *G01J 3/457* (2006.01)
  *H01L 23/482* (2006.01)
  *H10F 77/00* (2025.01)
  *H10F 77/124* (2025.01)
  *H10F 77/40* (2025.01)

(52) U.S. Cl.
  CPC ..... *H01L 23/4821* (2013.01); *H10F 77/1248* (2025.01); *H10F 77/147* (2025.01); *H10F 77/407* (2025.01); *H10F 77/933* (2025.01); *G01J 2003/102* (2013.01)

(56) References Cited

U.S. PATENT DOCUMENTS

2018/0267174 A1* 9/2018 Liang ................ G01T 1/247
2021/0305443 A1* 9/2021 Machinaga ........... H10F 77/206

FOREIGN PATENT DOCUMENTS

| | | |
|---|---|---|
| EP | 0718885 A2 | 6/1996 |
| JP | H4-167565 A | 6/1992 |
| JP | H11-307805 A | 11/1999 |
| JP | 2002-258084 A | 9/2002 |
| JP | 2004-273936 A | 9/2004 |
| JP | 2005-159088 A | 6/2005 |
| JP | 2011-114015 A | 6/2011 |
| JP | 2012-238812 A | 12/2012 |
| JP | 2013-041933 A | 2/2013 |
| JP | 2017-147428 A | 8/2017 |
| JP | 2018-054727 A | 4/2018 |

OTHER PUBLICATIONS

Li Qinglong et al, "High-Power Flip-Chip Bonded Photodiode With 110 GHz Bandwidth", Journal of Lightwave Technology, IEEE, USA vol. 34, No. 9, May 1, 2016, p. 2139-p. 2144, XP011604591.

* cited by examiner

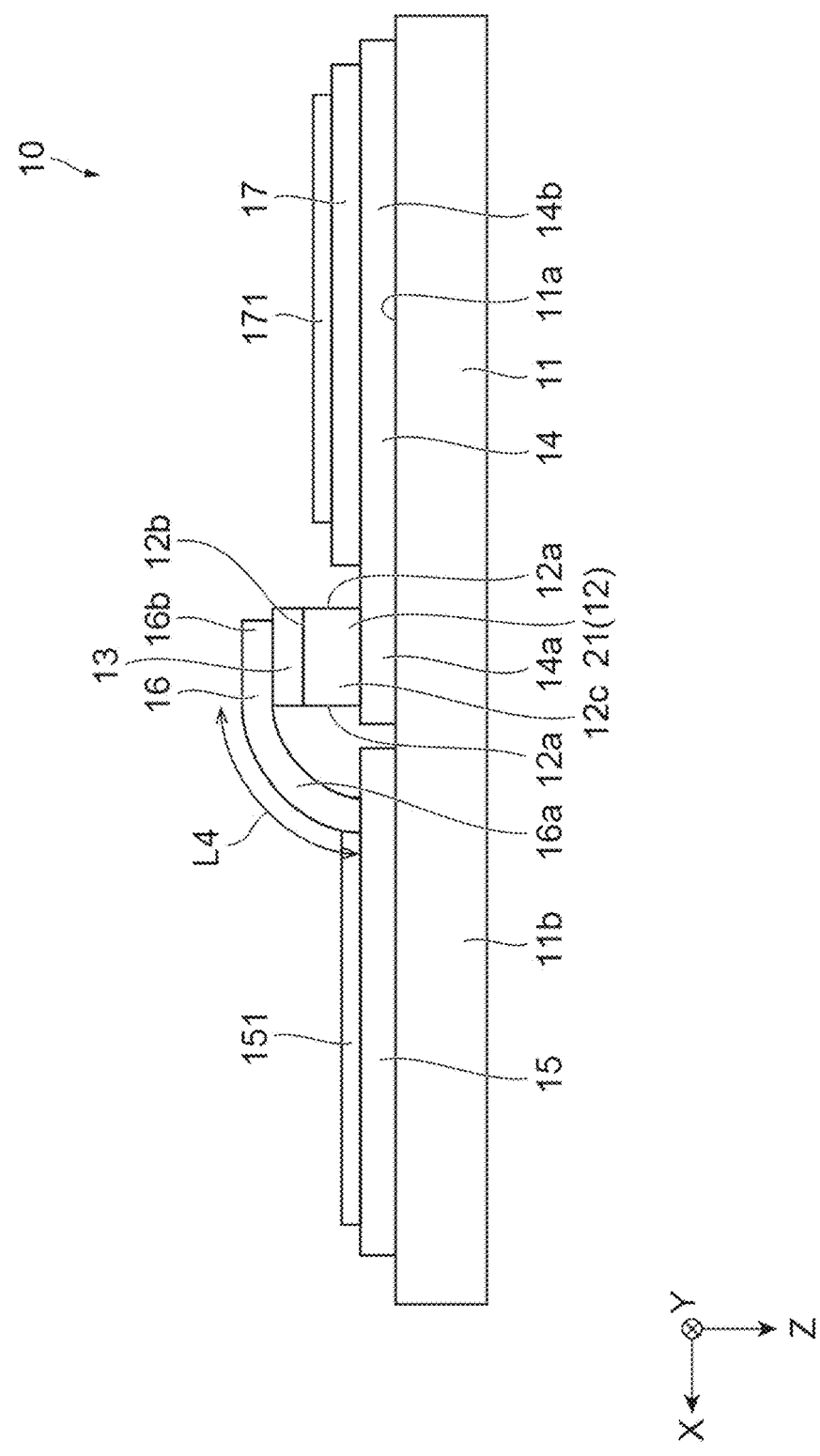

Fig.5

| SEMICONDUCTOR LAYER | | COMPOSITION | LAYER THICKNESS (nm) | DOPING | |
|---|---|---|---|---|---|
| FIRST CONTACT LAYER 13 | | InGaAs | 30 | Si doped: 2×10$^{18}$/cm$^3$ | |
| ABSORPTION REGION 22 | BARRIER LAYER 261 | InAlAs | 3 | undoped | ⎫ UNIT STACKED BODIES 24 × 90 |
| | WELL LAYER 271 | InGaAs | 4.4 | Si doped: 4×10$^{17}$/cm$^3$ | |
| TRANSPORT REGION 23 | BARRIER LAYER 262 | InAlAs | 2.5 | undoped | |
| | WELL LAYER 272 | InGaAs | 0.9 | undoped | |
| | BARRIER LAYER 263 | InAlAs | 4 | undoped | |
| | WELL LAYER 273 | InGaAs | 1.3 | undoped | |
| | BARRIER LAYER 264 | InAlAs | 3.3 | undoped | |
| | WELL LAYER 274 | InGaAs | 1.4 | undoped | |
| | BARRIER LAYER 265 | InAlAs | 3.6 | undoped | |
| | WELL LAYER 275 | InGaAs | 1.5 | undoped | |
| | BARRIER LAYER 266 | InAlAs | 2.8 | undoped | |
| | WELL LAYER 276 | InGaAs | 2.5 | undoped | |
| | BARRIER LAYER 267 | InAlAs | 2.7 | undoped | ⎭ |
| | WELL LAYER 277 | InGaAs | 2.8 | undoped | |
| SECOND CONTACT LAYER 14 | | InGaAs | 1200 | Si doped: 2×10$^{18}$/cm$^3$ | |

LIGHT DETECTION MODULE AND BEAT SPECTROMETER

TECHNICAL FIELD

One aspect of the present disclosure relates to a photodetection module and a beating spectroscopy device.

BACKGROUND ART

Patent Literature 1 discloses a quantum cascade detector. The quantum cascade detector detects light using intersubband transition (intersubband absorption) in a quantum well structure.

CITATION LIST

Patent Literature

Patent Literature 1: Japanese Unexamined Patent Publication No. 2017-147428

SUMMARY OF INVENTION

Technical Problem

The photodetector as described above requires an increase in response speed. In addition, ensuring reliability is also required. Therefore, an object of one aspect of the present disclosure is to provide a photodetection module capable of realizing increasing response speed and ensuring reliability, and a beating spectroscopy device capable of widening a wavelength scanning range.

Solution to Problem

A photodetection module according to one aspect of the present disclosure includes: a photodetector; and a fixing member to which the photodetector is fixed. The photodetector includes a semiconductor substrate including a major surface, a mesa portion including a semiconductor region that generates an electrical signal in accordance with an incident amount of detection light, and formed on the major surface of the semiconductor substrate, a first contact layer formed on a surface of the mesa portion on a side opposite to the semiconductor substrate, a second contact layer formed between the major surface of the semiconductor substrate and the mesa portion, and a first electrode formed in a planar shape on the major surface of the semiconductor substrate, and electrically connected to one of the first contact layer and the second contact layer. The fixing member includes an insulating substrate including a major surface, and a first wiring formed in a planar shape on the major surface of the insulating substrate. A recessed portion is formed in the major surface of the insulating substrate. At least a part of the mesa portion is disposed inside the recessed portion. The first electrode is electrically connected to the first wiring in a state where the first electrode is in surface contact with the first wiring.

In the photodetection module, the first electrode on the semiconductor substrate in the photodetector is electrically connected to the first wiring in a state where the first electrode is in surface contact with the first wiring on the insulating substrate in the fixing member. Accordingly, for example, compared to when the first electrode and the first wiring are connected to each other by wire bonding, the generation of inductance caused by wires can be avoided, and inductance can be reduced. As a result, the response speed can be increased. In addition, since the first electrode and the first wiring are connected to each other in a surface contact state, the photodetector and the fixing member can be firmly fixed, and reliability can be ensured. Further, in the photodetection module, at least a part of the mesa portion of the photodetector is disposed inside the recessed portion formed in the insulating substrate. Accordingly, the mesa portion that is delicate can be protected, and reliability can be ensured. Therefore, according to the photodetection module, increasing response speed and ensuring reliability can be realized.

The semiconductor region of the mesa portion may include an active layer in which absorption regions that absorb the detection light through intersubband absorption and transport regions that transport electrons excited by the intersubband absorption are alternately stacked. When the active layer includes the mesa portion as described above, from the viewpoint of increasing response speed, reducing inductance is particularly important. In this respect, in the photodetection module, as described above, inductance can be reduced, and increasing response speed can be realized.

One end surface of the mesa portion in a direction parallel to the major surface of the semiconductor substrate may be an incident surface of the detection light. In this case, light can be effectively absorbed in the mesa portion, and output signal intensity can be ensured.

One end surface of the mesa portion in a direction parallel to the major surface of the semiconductor substrate may be flush with a side surface of the semiconductor substrate. In this case, the end surface of the mesa portion can be easily used as an incident surface of the detection light.

The photodetection module according to one aspect of the present disclosure may further include a lens that is disposed to face the end surface of the mesa portion, and that converges the detection light toward the end surface of the mesa portion. In this case, a width (length in a direction perpendicular to an optical waveguide direction) of the end surface of the mesa portion can be narrowed, and the area of the mesa portion in a plan view can be reduced. As a result, parasitic capacitance can be reduced, and the response speed can be further increased. In addition, when the area of the mesa portion is assumed to be constant, the length of the mesa portion in the optical waveguide direction can be lengthened by narrowing the width of the mesa portion. As a result, light can be effectively absorbed in the mesa portion, and output signal intensity can be ensured.

The recessed portion may be open on a side surface of the insulating substrate. In this case, the detection light can be easily incident on the end surface of the mesa portion. Alternatively, the recessed portion may be configured as a hole formed in the major surface of the insulating substrate to be separated from an outer edge of the major surface.

The photodetector may further include a connection wiring electrically connected to the first electrode and to the one of the first contact layer and the second contact layer. At least a part of the connection wiring may be disposed inside the recessed portion. In this case, the connection wiring can be protected, and reliability can be certainly ensured.

The connection wiring may be an air bridge wiring having a sheet shape. In this case, the air bridge wiring that is delicate can be protected by being disposed inside the recessed portion, and reliability can be certainly ensured.

The photodetector may further include a second electrode formed in a planar shape on the major surface of the semiconductor substrate, and electrically connected to the other of the first contact layer and the second contact layer.

The fixing member may further include a second wiring formed in a planar shape on the major surface of the insulating substrate. The second electrode may be electrically connected to the second wiring in a state where the second electrode is in surface contact with the second wiring. In this case, for example, compared to when the second electrode and the second wiring are connected to each other by wire bonding, inductance can be reduced, and the response speed can be further increased. In addition, since the second electrode and the second wiring are connected to each other in a surface contact state, the photodetector and the fixing member can be firmly fixed, and reliability can be certainly ensured.

When viewed in a direction perpendicular to the major surface of the semiconductor substrate, the second contact layer may include a first portion located between the major surface of the semiconductor substrate and the mesa portion, and a second portion located outside the mesa portion. The second electrode may be formed on the second portion of the second contact layer. In this case, a large area of the second electrode can be ensured, and a large contact area between the second electrode and the second wiring can be ensured.

The first electrode may be in surface contact with the first wiring with a solder layer interposed therebetween. The second electrode may be in surface contact with the second wiring with a solder layer interposed therebetween. In this case, the first electrode and the first wiring can be electrically and mechanically firmly connected to each other, and the second electrode and the second wiring can be electrically and mechanically firmly connected to each other. In addition, when the first electrode and the first wiring are connected to each other and the second electrode and the second wiring are connected to each other, even in a case where there is a height difference between the first electrode and the second electrode, the height difference can be absorbed by the solder layers, and good surface contact at each connection location can be realized.

The photodetector may include a height adjustment layer formed in a planar shape on the major surface of the semiconductor substrate, and electrically isolated from the second contact layer. The first electrode may be formed on the height adjustment layer. In this case, when the first electrode and the first wiring are connected to each other and the second electrode and the second wiring are connected to each other, even in a case where there is a height difference between the first electrode and the second electrode, the height difference between the first electrode and the second electrode can be reduced by the height adjustment layer, and good surface contact at each connection location can be realized.

The first wiring may have a length of ¼ or less of a wavelength of an electrical signal that propagates through the first wiring. In this case, impedance matching can be realized.

Both side surfaces of the mesa portion in a direction perpendicular to an optical waveguide direction may be exposed. In this case, the generation of parasitic capacitance can be suppressed, and the response speed can be further increased.

The mesa portion may be separated from an inner surface of the recessed portion. In this case, the mesa portion can be certainly protected.

A beating spectroscopy device according to one aspect of the present disclosure includes: a fixed wavelength light source; a variable wavelength light source; and the photodetection module that detects light from the fixed wavelength light source and light from the variable wavelength light source as the detection light. The light from the fixed wavelength light source and the light from the variable wavelength light source are detected by the photodetector while a wavelength of the light from the variable wavelength light source is changed to scan a frequency of a beating signal having a frequency in accordance with a wavelength difference between the light from the fixed wavelength light source and the light from the variable wavelength light source. In the photodetection module included in the beating spectroscopy device, the response speed is increased for the above-described reasons. For this reason, in the beating spectroscopy device, a wavelength scanning range in beating spectroscopy can be widened.

Advantageous Effects of Invention

According to one aspect of the present disclosure, it is possible to provide the photodetection module capable of realizing increasing response speed and ensuring reliability, and the beating spectroscopy device capable of widening the wavelength scanning range.

BRIEF DESCRIPTION OF DRAWINGS

FIG. 4 is a front view of the photodetector.

FIG. 5 is a table showing a configuration of the photodetector.

DESCRIPTION OF EMBODIMENTS

Hereinafter, one embodiment of the present invention will be described in detail with reference to the drawings. In the following description, the same reference signs are used for the same or corresponding elements, and duplicated descriptions will be omitted.

[Photodetection Module]

Figure 1:
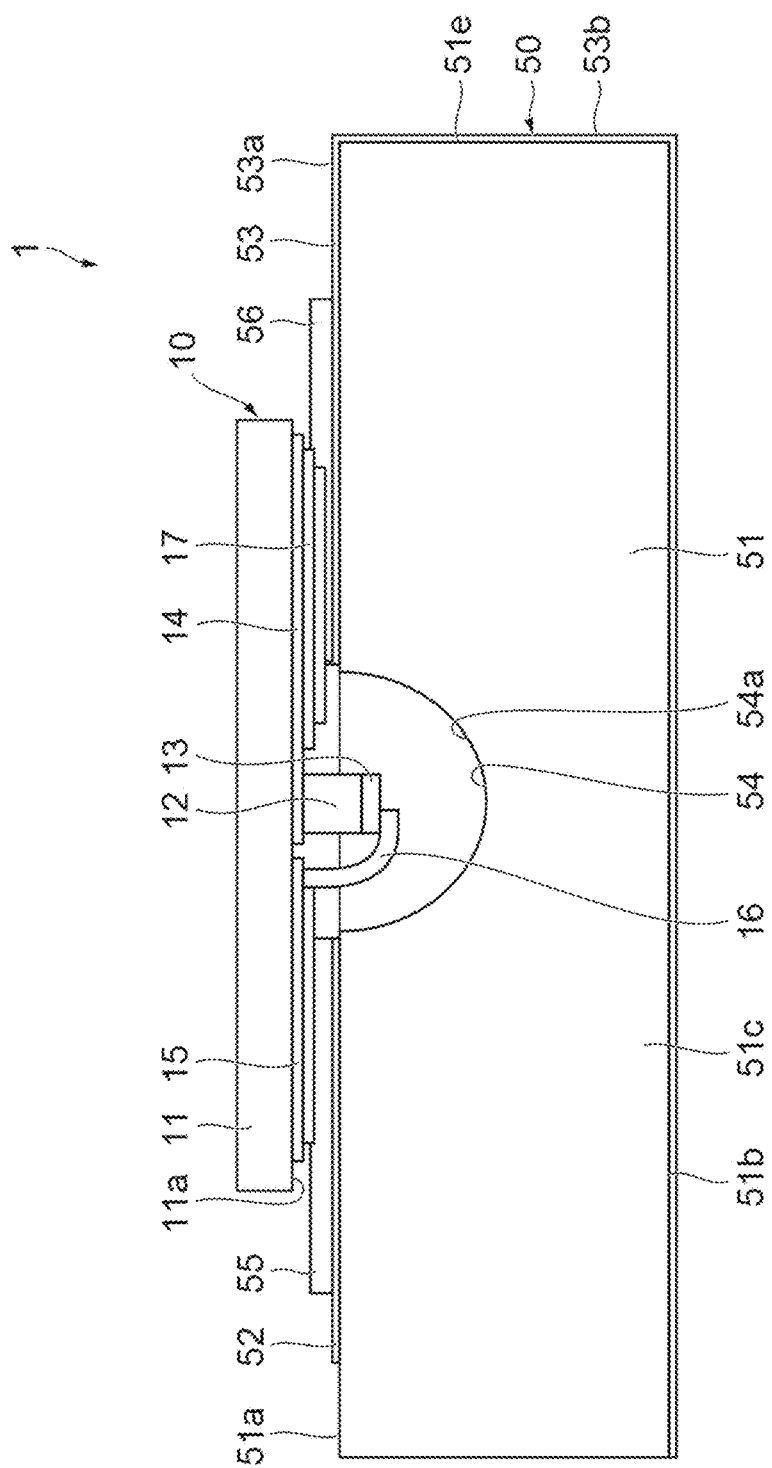
FIG. 1 is a front view of a photodetection module of an embodiment.

As shown in FIG. 1, the photodetection module 1 includes a photodetector 10 and a fixing member (submount) 50 to which the photodetector 10 is fixed. The photodetector 10 is, for example, a quantum cascade detector (QCD), and detects detection light DL using intersubband transition (intersubband absorption) in a quantum well structure.

[Photodetector]

Figure 2:
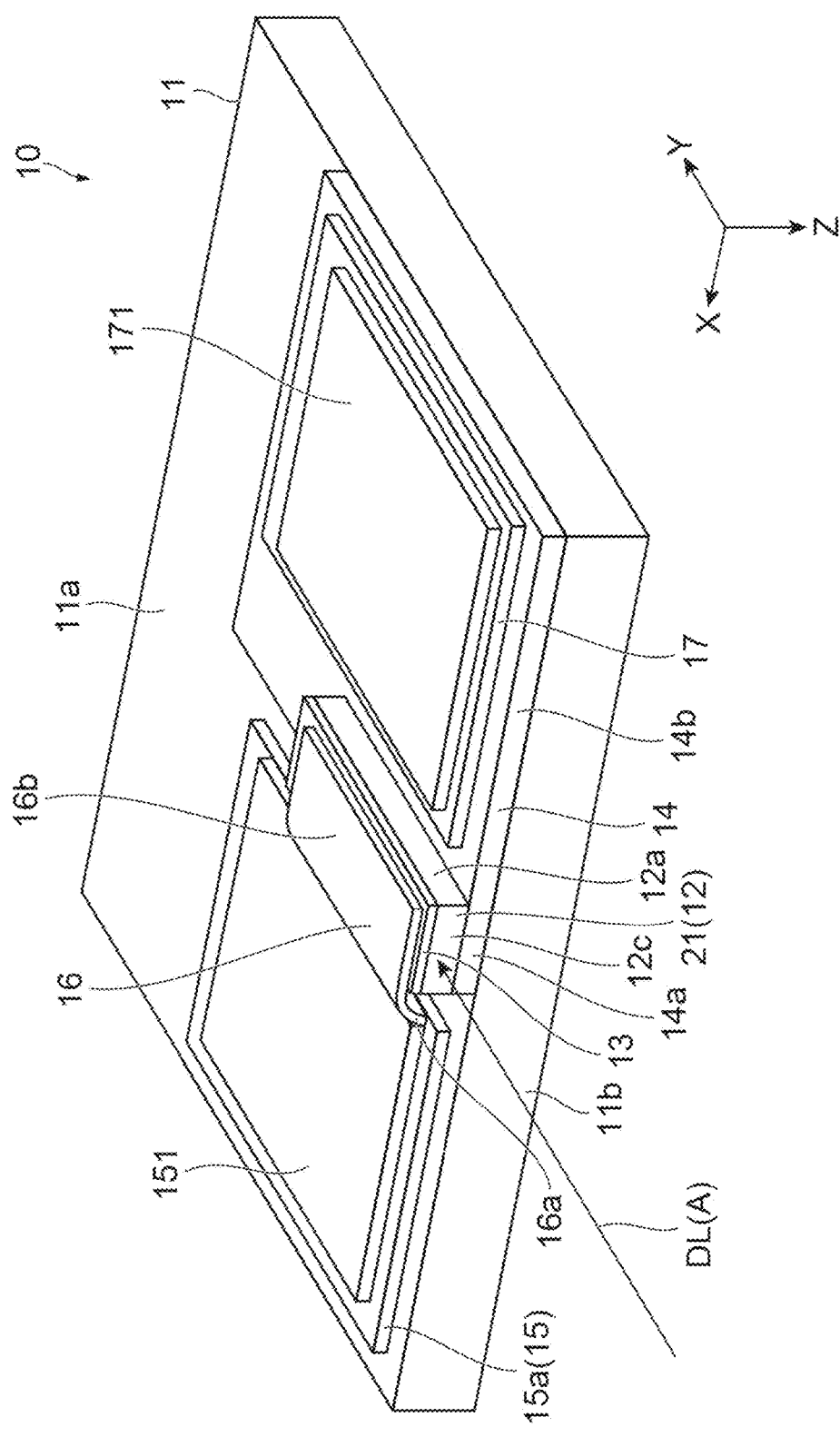
FIG. 2 is a perspective view of a photodetector.
Figure 3:
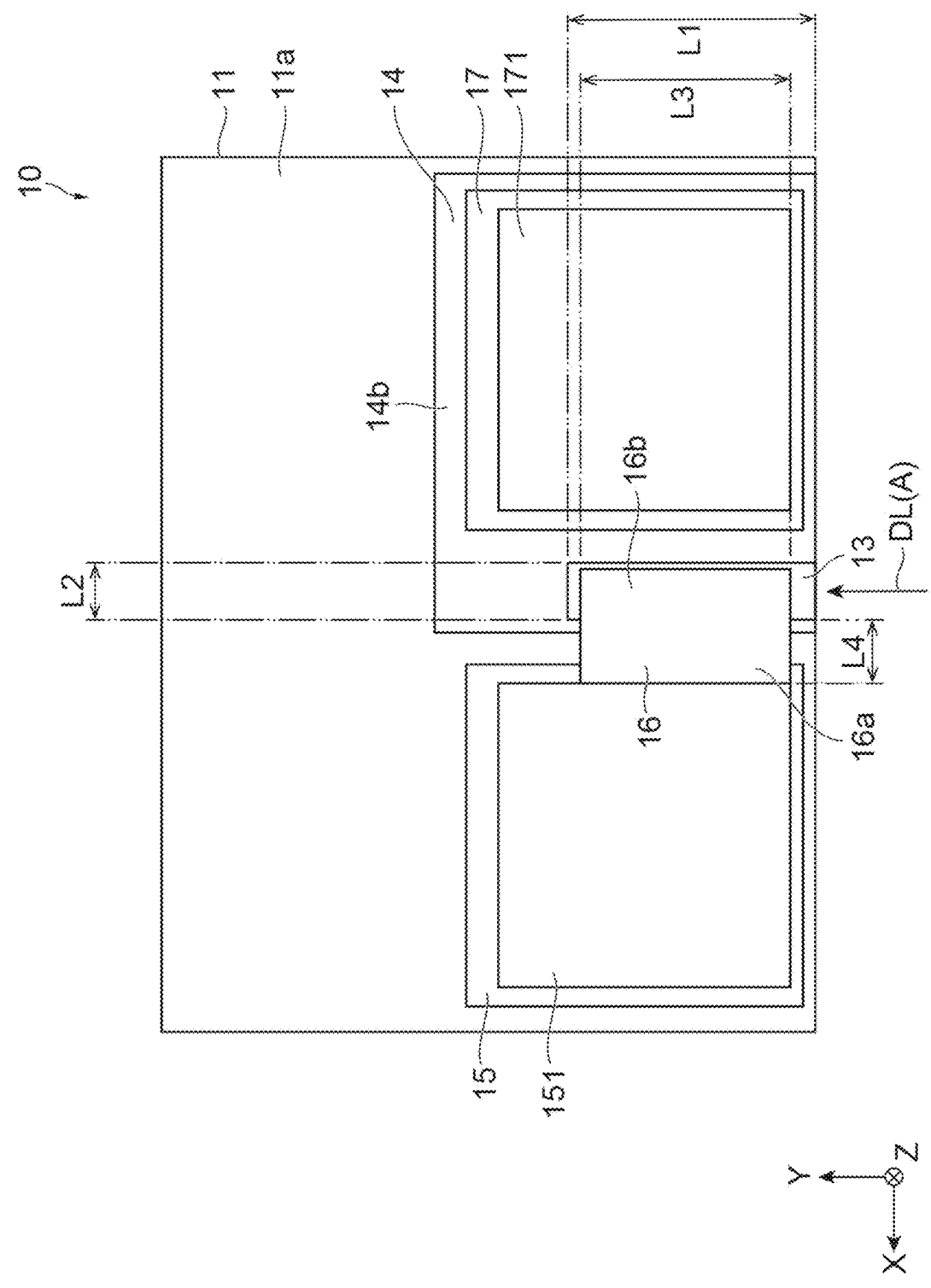
FIG. 3 is a plan view of the photodetector.

As shown in FIGS. 2, 3, and 4, the photodetector 10 includes a semiconductor substrate 11, a mesa portion 12, a first contact layer 13, a second contact layer 14, a first electrode 15, an air bridge wiring 16, and a second electrode 17.

The semiconductor substrate 11 is formed in, for example, a rectangular flat plate shape, and has a flat major surface 11a. The semiconductor substrate 11 is, for example, a semi-insulating InP substrate. Hereinafter, a width direction, a depth direction, and a thickness direction of the semiconductor substrate 11 will be described as an X direction, a Y direction, and a Z direction, respectively. The X direction, the Y direction, and the Z direction are orthogonal to each other. Incidentally, in FIGS. 2 to 4, each configuration of the photodetector 10 is disposed to be inverted with respect to the X direction relative to FIG. 1. Actually, each configuration of the photodetector 10 is disposed to be inverted with respect to the X direction relative to the disposition shown in FIGS. 2 to 4. In short, as will be described later, each element may be disposed such that the first electrode 15 is connected to a first wiring 52 and the second electrode 17 is connected to a second wiring 53.

The mesa portion 12 is formed on the major surface 11a of the semiconductor substrate 11 to extend along an optical waveguide direction A. The optical waveguide direction A is parallel to the Y direction. The mesa portion 12 is formed on the major surface 11a with the second contact layer 14 interposed therebetween, and protrudes from the semiconductor substrate 11 in the Z direction. Each of a pair of side surfaces 12a of the mesa portion 12 in the X direction is exposed. Namely, each of the side surfaces 12a is not covered with other elements. The side surfaces 12a are surfaces extending to intersect the X direction, and are flat surfaces perpendicular to the X direction in this example.

The mesa portion 12 includes an active layer 21. As shown in FIG. 5, the active layer 21 includes a plurality of absorption regions 22 and a plurality of transport regions 23 that are alternately stacked along the Z direction (direction perpendicular to the major surface 11a of the semiconductor substrate 11), and has a quantum cascade structure. In the active layer 21, unit stacked bodies 24 each formed of a pair of the absorption region 22 and the transport region 23 are repeatedly stacked. In this example, the active layer 21 is configured to have a peak sensitivity wavelength of 4.5 μm, and includes the unit stacked bodies 24 of 90 cycles. The number of cycles of the unit stacked bodies 24 may be, for example, 10 or more and 150 or less.

Each of the absorption regions 22 includes a barrier layer 261 and a well layer 271, and absorbs the detection light DL through intersubband absorption. Each of the transport regions 23 includes a plurality of barrier layers 262 to 267 and a plurality of well layers 272 to 277, and transports electrons excited by intersubband absorption in the absorption region 22, to the absorption region 22 of the next cycle. One example of compositions, layer thicknesses, and doping states of the barrier layers 261 to 267 and of the well layers 272 to 277 is as shown in FIG. 5.

When the detection light DL is incident on the active layer 21, the detection light DL is absorbed in the active layer 21. More specifically, electron excitation by intersubband absorption, the relaxation and transport of excited electrons, and the extraction of electrons to the unit stacked body 24 of the next cycle are repeated in a plurality of the unit stacked bodies 24, so that light absorption occurs in the active layer 21 in a cascade manner. In the photodetection module 1, a current generated by the light absorption is extracted as an electrical signal, and the detection light DL is detected by measuring an amount of the current. Namely, the active layer 21 functions as a semiconductor region that generates an electrical signal in accordance with an incident amount of the detection light DL.

The mesa portion 12 is formed long in the Y direction, and is formed in, for example, a rectangular shape in which long sides are parallel to the Y direction, in a plan view (when viewed in the Z direction). Namely, in a plan view, a length L1 of the mesa portion 12 in the Y direction (optical waveguide direction A) is longer than a length (width) L2 of the mesa portion 12 in the X direction (direction perpendicular to the optical waveguide direction A). The length L1 is, for example, 50 μm or more. The length L1 is, for example, approximately 50 μm to 3000 μm, and is 100 μm in this example. The length L2 is, for example, approximately 10 μm to 1000 μm, and is 25 μm in this example. An aspect ratio (ratio of the length L1 to the length L2) of the mesa portion 12 in a plan view is 1 to 100. The aspect ratio of the mesa portion 12 may be 1.5 to 50, preferably 2 to 10. The lengths L1 and L2 may be 10 μm or more. When the length L1 is less than 50 μm, it is difficult to ensure output signal intensity. When the length L2 is less than 10 μm, it is difficult to form the air bridge wiring 16. When the length L1 is greater than 3000 μm or the length L2 is greater than 1000 μm, the element size increases, and it is difficult to realize a high cutoff.

The first contact layer 13 is an upper contact layer formed on a surface 12b of the mesa portion 12 on a side opposite to the semiconductor substrate 11. The second contact layer 14 is a lower contact layer formed between the major surface 11a of the semiconductor substrate 11 and the mesa portion 12. One example of compositions, layer thicknesses, and doping states of the first contact layer 13 and of the second contact layer 14 is as shown in FIG. 5.

The second contact layer 14 is formed in a rectangular shape in which a length of each side is longer than that of the mesa portion 12, and includes a portion protruding from the mesa portion 12. Namely, in a plan view, the second contact layer 14 includes a first portion 14a located between the major surface 11a of the semiconductor substrate 11 and the mesa portion 12, and a second portion 14b located outside the mesa portion 12.

The mesa portion 12, the first contact layer 13, and the second contact layer 14 are formed on the major surface 11a of the semiconductor substrate 11, for example, by crystal growth. The mesa portion 12, the first contact layer 13, and the second contact layer 14 are formed by performing etching to reach a surface of the second contact layer 14 or the inside of the second contact layer 14, using a photolithography technology and a dry etching technology after the crystal growth. During manufacturing, for example, a plurality of elements are collectively formed by forming a plurality of portions corresponding to the mesa portion 12, to the first contact layer 13, and to the second contact layer 14 on a wafer, and then by cutting the wafer.

In this example, one end surface 12c of the mesa portion 12 in the Y direction (optical waveguide direction A) (direction parallel to the major surface 11a of the semiconductor substrate 11) is an incident surface (light receiving surface) of the detection light DL. The detection light DL incident from the end surface 12c travels through the mesa portion 12 along the optical waveguide direction A. The end surface 12c is flush with a side surface 11b of the semiconductor substrate 11. Namely, the end surface 12c and the side surface 11b are located on the same plane. The side surface 11b is a surface extending to intersect the Y direction, and is a flat surface perpendicular to the Y direction in this example. In this example, the side surface 11b and the end surface 12c are cleavage surfaces formed by cutting the wafer.

The first electrode 15 is formed in a planar shape on the major surface 11a of the semiconductor substrate 11. The first electrode 15 is made of, for example, gold and is formed in a square shape by patterning. The first electrode 15 includes a connection portion 15a located on one side in the X direction with respect to the mesa portion 12. In this example, the connection portion 15a is the entirety of the first electrode 15. The first electrode 15 is electrically connected to the first contact layer 13 through the air bridge wiring 16. The first electrode 15 is provided to extract a current output from the active layer 21, to the outside. An area of the first electrode 15 is, for example, 10000 $\mu m^2$ or more. In this case, the first electrode 15 and the first wiring 52 to be described later can be suitably brought into surface contact with each other. In this example, dimensions of the first electrode 15 are 400 μm×400 μm.

The air bridge wiring 16 is a connection wiring that is electrically connected to the first contact layer 13 and the first electrode 15. The air bridge wiring 16 is led out from the first contact layer 13 to the one side in the X direction, and is bridged between the first contact layer 13 and the first electrode 15. In this example, the air bridge wiring 16 is led out from the first contact layer 13 in a direction parallel to the X direction. In a plan view, the air bridge wiring 16 is led out from an end portion of the first contact layer 13 (mesa portion 12) in the X direction. The air bridge wiring 16 is an aerial wiring (three-dimensional wiring) including a bridge portion 16a extending in air. The bridge portion 16a is electrically connected to the first electrode 15 (connection portion 15a) through a plating layer 151 to be described later. The air bridge wiring 16 further includes a portion 16b having a planar shape that is formed on the first contact layer 13. The bridge portion 16a is integrally formed with the portion 16b.

The air bridge wiring 16 is formed, for example, by the following step. First, a resist is formed in a region between the mesa portion 12 and the first electrode 15 on the major surface 11a of the semiconductor substrate 11 by patterning. Subsequently, a gold thin film having a thickness of approximately 5 μm is formed on the resist by plating, and thereafter, the resist is removed. Accordingly, the air bridge wiring 16 having a sheet shape is formed.

The bridge portion 16a is formed in a wide sheet shape (layer shape). A length (width) L3 of the bridge portion 16a in the Y direction (optical waveguide direction A) is longer than a length L4 of the bridge portion 16a in the X direction. In this example, the bridge portion 16a extends curvedly when viewed in the Y direction. In this case, as shown in FIG. 4, the length L4 of the bridge portion 16a in the X direction is a length (actual length) of the bridge portion 16a along an extending direction. The length L3 is, for example, 50 μm or more. The length L3 is, for example, approximately 50 μm to 3000 μm, and is 80 μm in this example. The length L4 is, for example, approximately 5 μm to 200 μm, and is 30 μm in this example. An aspect ratio (ratio of the length L3 to the length L4) of the bridge portion 16a may be 0.25 to 100, preferably 1 to 50. The aspect ratio of the bridge portion 16a may be more preferably 1 to 20, further preferably 2 to 10. A thickness of the bridge portion 16a (air bridge wiring 16) in the Z direction is equal to or more than 1 μm and equal to or less than 10 μm.

The second electrode 17 is formed in a planar shape on the second portion 14b of the second contact layer 14. In other words, the second electrode 17 is formed in a planar shape on the major surface 11a of the semiconductor substrate 11 with the second contact layer 14 interposed therebetween. The second electrode 17 is made of, for example, gold and is formed in a square shape by patterning. The second electrode 17 is disposed on the other side in the X direction (side opposite the first electrode 15) with respect to the mesa portion 12. The second electrode 17 is electrically connected to the second contact layer 14. The second electrode 17 is provided to extract a current output from the active layer 21, to the outside. The second electrode 17 is electrically isolated from the first electrode 15. An area of the second electrode 17 is, for example, 10000 $\mu m^2$ or more. In this case, the second electrode 17 and the second wiring 53 to be described later can be suitably brought into surface contact with each other. In this example, dimensions of the second electrode 17 are 400 μm×400 μm, and are the same as those of the first electrode 15.

When plating is performed in the step of forming the air bridge wiring 16 described above, plating layers may be formed on the first electrode 15 and on the second electrode 17. In FIGS. 2 to 4, these plating layers are indicated by reference signs 151 and 171. The plating layers 151 and 171 can be regarded as forming the first electrode 15 and the second electrode 17, respectively. In this example, the plating layer 151 is formed with a size smaller than the first electrode 15 (formed on only a part of the first electrode 15), but may be formed on the entire surface of the first electrode 15. Similarly, the plating layer 171 is formed with a size smaller than the second electrode 17, but may be formed on the entire surface of the second electrode 17. The plating layer 151 can be regarded as forming the air bridge wiring 16. The plating layers 151 and 171 may not be formed.

[Fixing Member]

Figure 6:
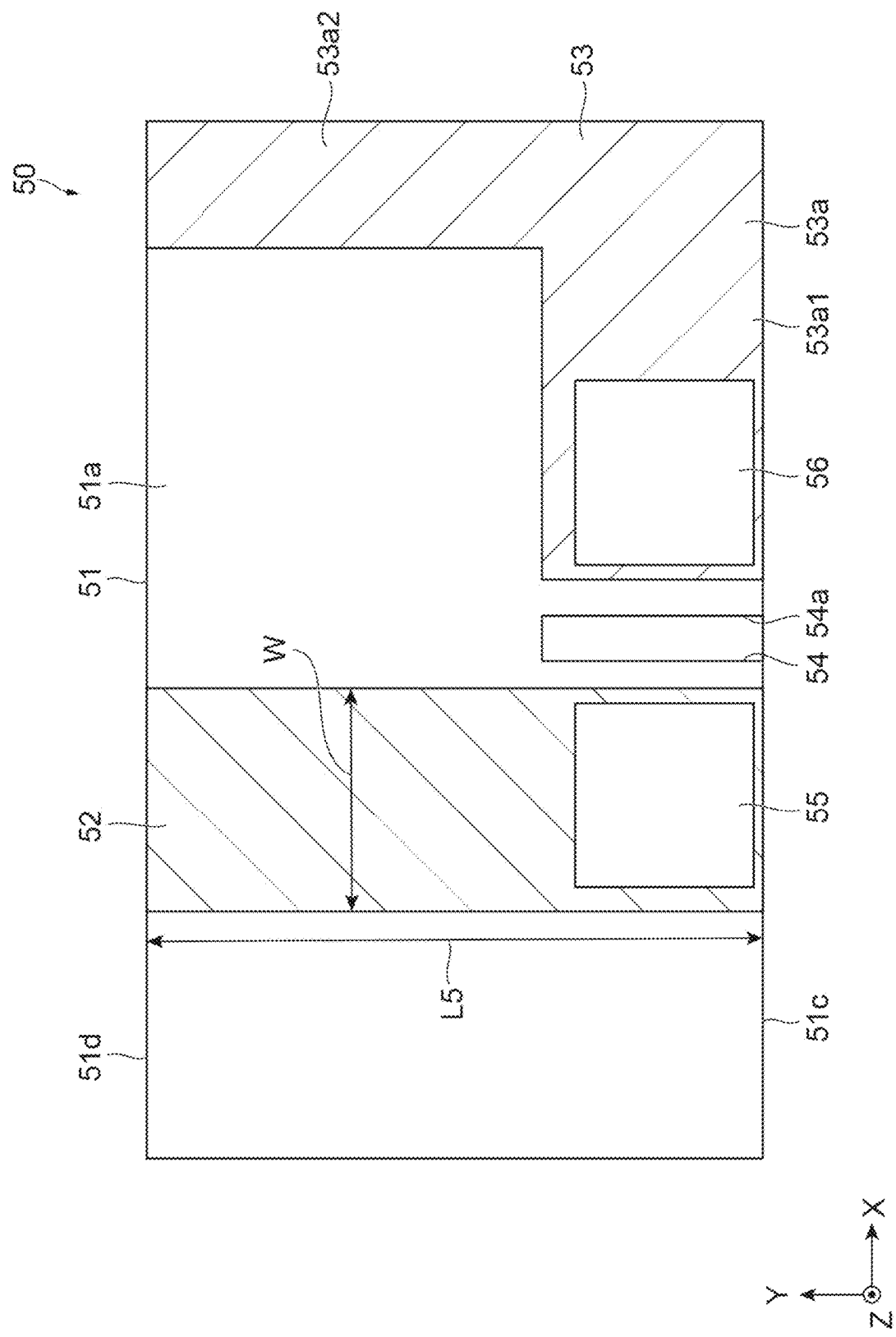
FIG. 6 is a plan view of a fixing member.

As shown in FIGS. 1 and 6, the fixing member 50 includes an insulating substrate 51, the first wiring 52, and the second wiring 53. In FIG. 6, the first wiring 52 and the second wiring 53 are hatched for ease of understanding. The insulating substrate 51 is formed in, for example, a rectangular flat plate shape, and has a major surface 51a and a 51b opposite the major surface 51a. In this example, the major surfaces 51a and 51b are flat surfaces parallel to each other. A base material of the insulating substrate 51 is, for example, alumina (aluminum oxide). In this case, dielectric loss in a high frequency band can be reduced. The base material of the insulating substrate 51 may be SiC or ceramic that is a highly insulating material.

A recessed portion 54 is formed in the major surface 51a of the insulating substrate 51. In this example, the recessed portion 54 is a groove extending along the Y direction (optical waveguide direction A), and is open on a side surface 51c of the insulating substrate 51. Namely, the recessed portion 54 extends to reach the side surface 51c. The side surface 51c is a surface extending to intersect the Y direction, and is a flat surface perpendicular to the Y direction in this example. As one example, the recessed portion 54 has a rectangular shape in a plan view, and has a substantially semicircular shape in a cross section perpendicular to the Y direction.

The first wiring 52 is formed in a planar shape on the major surface 51a of the insulating substrate 51. The first wiring 52 is made of, for example, gold and is formed in a predetermined shape by patterning. The first wiring 52 is disposed on the one side in the X direction with respect to the recessed portion 54. The first wiring 52 is formed in a rectangular shape in which long sides are parallel to the Y direction, and extends across the side surfaces 51c and 51d of the insulating substrate 51. The side surface 51d is a surface of the insulating substrate 51 on a side opposite to the side surface 51c.

The second wiring 53 is formed in a planar shape on the major surface 51a of the insulating substrate 51. The second wiring 53 is electrically isolated from the first wiring 52. The second wiring 53 is made of, for example, gold and is formed in a predetermined shape by patterning. The second wiring 53 is formed to reach (wrap around) from the major surface 51a of the insulating substrate 51 to the major surface 51b through a side surface 51e. Namely, the second wiring 53 includes a first portion 53a disposed on the major surface 51a, and a second portion 53b disposed over the major surface 51b and the side surface 51e. The first portion 53a is disposed on the other side in the X direction (side opposite the first wiring 52) with respect to the recessed portion 54. The first portion 53a includes a portion 53a1 formed in a rectangular shape in which long sides are parallel to the X direction, and a portion 53a2 formed in a rectangular shape in which long sides are parallel to the Y direction. The portion 53a2 extends from the portion 53a1 to reach the side surface 51d of the insulating substrate 51. The second portion 53b is formed on the entireties of the major surface 51b and of the side surface 51e.

A solder layer 55 is formed on the first wiring 52, and a solder layer 56 is formed on the second wiring 53. The solder layer 56 is formed on the portion 53a1 of the second wiring 53. Each of the solder layers 55 and 56 is formed in, for example, a square shape from a metal material, and has a thickness of approximately equal to or more than 1 μm and equal to or less than 10 μm.

As shown in FIG. 1, the photodetector 10 is fixed to the fixing member 50 in a state where the major surface 11a of the semiconductor substrate 11 faces the major surface 51a of the insulating substrate 51. In a fixed state where the photodetector 10 is fixed to the fixing member 50, at least a part of the mesa portion 12 is disposed inside the recessed portion 54. In this example, a tip portion (end portion opposite the semiconductor substrate 11 in the Y direction) of the mesa portion 12 is disposed inside the recessed portion 54. The mesa portion 12 is separated from an inner surface 54a of the recessed portion 54. A longitudinal direction of the mesa portion 12 is parallel to a longitudinal direction of the recessed portion 54. The end surface 12c of the mesa portion 12 is exposed from the recessed portion 54 when viewed in the Y direction. In the fixed state, a part of the air bridge wiring 16 (bridge portion 16a) is also disposed inside the recessed portion 54 to be separated from the inner surface 54a. Accordingly, a connection portion between the air bridge wiring 16 and the first contact layer 13 is disposed inside the recessed portion 54.

The photodetector 10 is fixed to the fixing member 50 by connecting the first electrode 15 to the first wiring 52 and by connecting the second electrode 17 to the second wiring 53. The first electrode 15 is fusion-bonded to the first wiring 52 using the solder layer 55, and is electrically connected to the first wiring 52 in a state where the first electrode 15 is in surface contact with the first wiring 52 with the solder layer 55 interposed therebetween. The second electrode 17 is fusion-bonded to the second wiring 53 using the solder layer 56, and is electrically connected to the second wiring 53 in a state where the second electrode 17 is in surface contact with the second wiring 53 with the solder layer 56 interposed therebetween. Each of a contact area between the first electrode 15 and the first wiring 52 and a contact area between the second electrode 17 and the second wiring 53 is 10000 μm² or more. In the fixed state, a part of the first wiring 52 is exposed such that a terminal 81 of a connector 80 to be described later can come into contact therewith (FIGS. 7 and 8).

[Mounting State of Photodetection Module]

Figure 7:
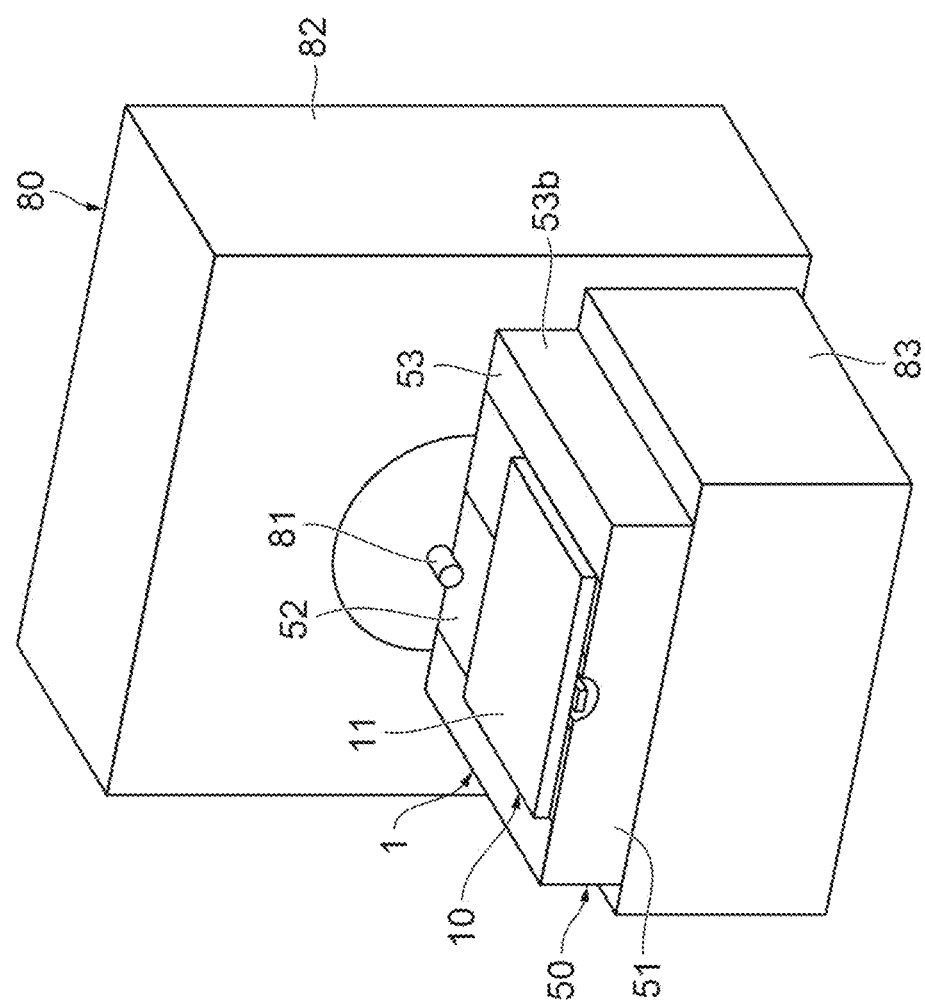
FIG. 7 is a perspective view showing a mounting state of the photodetection module.
Figure 8:
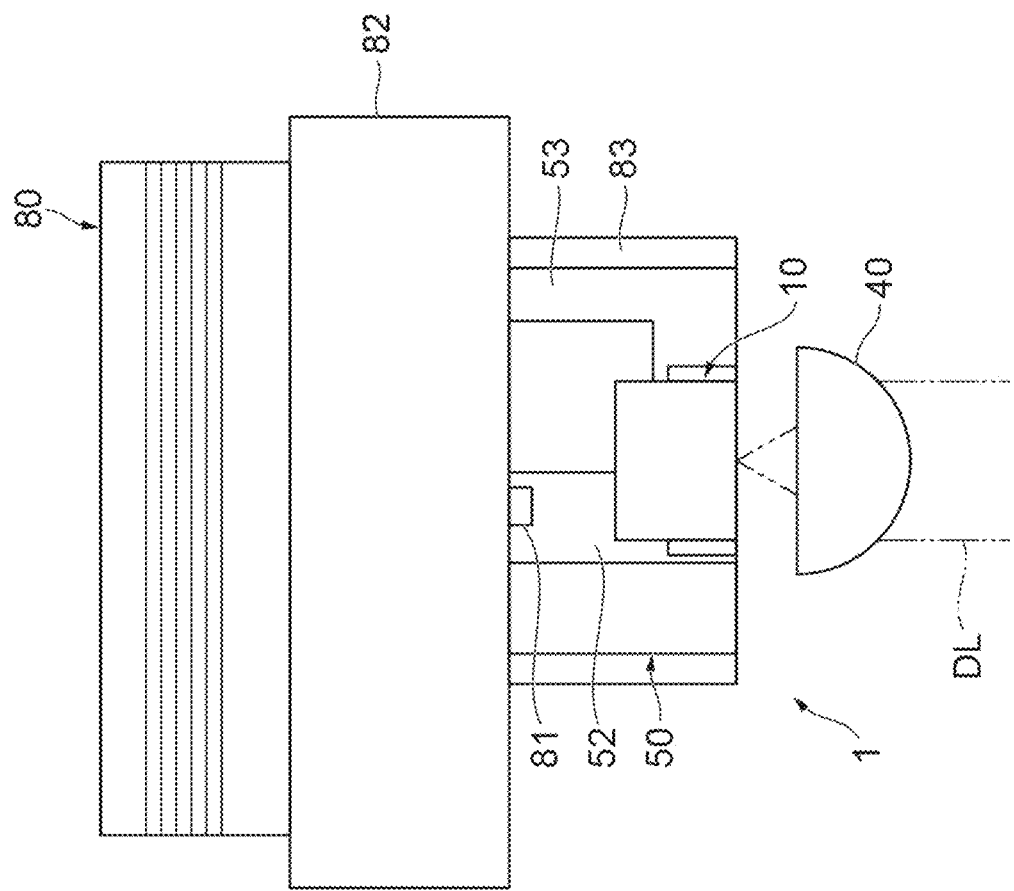
FIG. 8 is a plan view showing a mounting state of the photodetection module.
Figure 9:
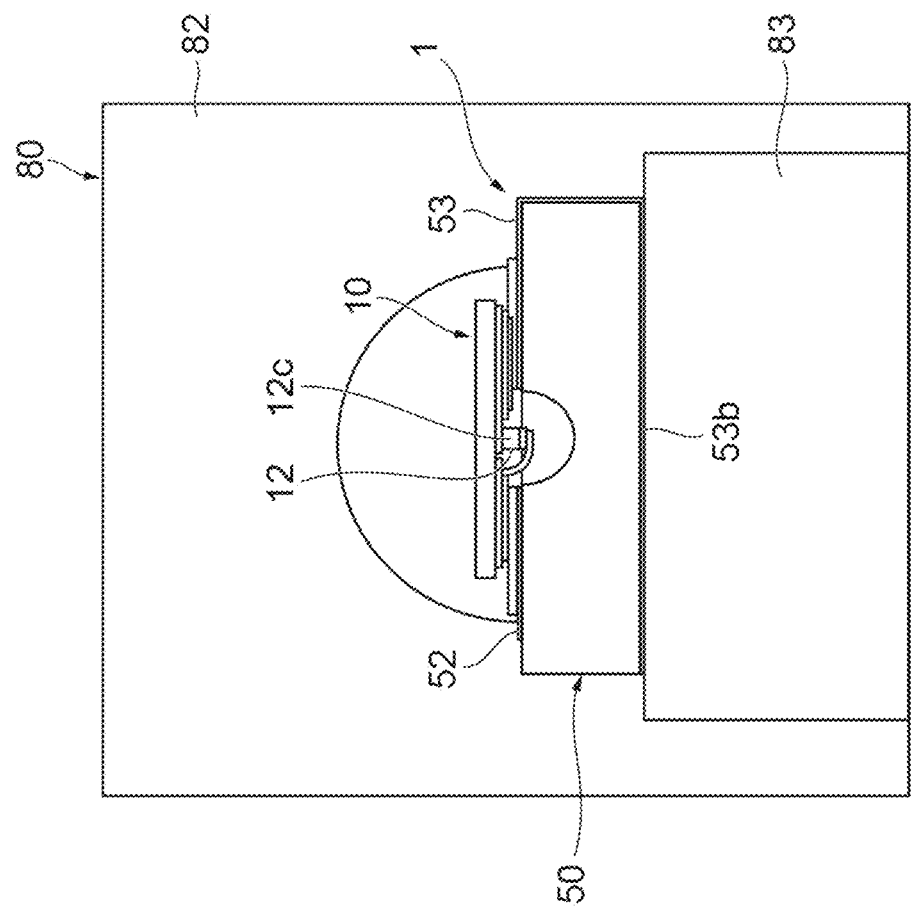
FIG. 9 is a front view showing a mounting state of the photodetection module.

As shown in FIGS. 7, 8, and 9, for example, the photodetection module 1 is used by being connected to the connector 80. The connector 80 is, for example, a SMA connector and includes the terminal 81 that is electrically connected to a signal wire of a SMA cable. The terminal 81 is mechanically connected to the first wiring 52 of the fixing member 50, and is electrically connected to the first wiring 52. Alternatively, the terminal 81 may be connected to the first wiring 52 by soldering. In such a manner, in this example, the first wiring 52 is a signal side wiring that is electrically connected to the signal wire.

The connector 80 further includes a body member 82 and a support member 83 that is integrally formed with the body member 82. The body member 82 and the support member 83 are electrically connected to a ground wire of the SMA cable. The photodetection module 1 is fixed to the connector 80 by connecting the fixing member 50 to the support member 83. For example, the second portion 53b of the second wiring 53 of the fixing member 50 is connected to a gold layer formed on a surface of the support member 83 by soldering. For example, the gold layer is formed to cover the entire surface of the support member 83. Alternatively, the body member 82 may be configured separately from the support member 83. In this case, the support member 83 to which the fixing member 50 is connected may be fixed to the body member 82 by screwing or by soldering. The second wiring 53 is electrically connected to the ground wire by the above-described connection. Namely, in this example, the second wiring 53 is a ground side wiring that is electrically connected to the ground wire. In this example, electrical connection between the photodetector 10 and the connector 80 is realized without using bonding wires (wireless connection). Accordingly, the generation of inductance caused by the bonding wires can be avoided. In addition, when bonding wires are used, the wires may be damaged by impact, being caught, or the like, and thus care must be taken in handling the device. In contrast, in this example, since bonding wires are not used, the handling of the device can be facilitated.

A shape (wiring pattern) of the first wiring 52 is set in consideration of impedance matching. In this example, the first wiring 52 is configured as a microstrip line. As one example, when a thickness of the insulating substrate 51 is 0.5 mm, a dielectric constant of the insulating substrate 51 is 9.8, a thickness of the first wiring 52 is 0.8 μm, and a matching resistance value at 20 GHz is 50Ω, a width W of the first wiring 52 is set to 0.5 mm or less, and a length L5 of the first wiring 52 is set to 1.45 mm or less (FIG. 6). Accordingly, the length L5 of the first wiring 52 is ¼ or less of a wavelength (electrical length) of an electrical signal propagating through the first wiring 52. In such a manner, impedance matching in a desired frequency band can be realized by setting the length L5 of the first wiring 52 to ¼ or less of an electrical length calculated based on design parameters of the first wiring 52. Incidentally, the first wiring 52 may be configured as a coplanar line instead of a microstrip line.

As shown in FIG. 8, the photodetection module 1 (photodetector 10) further includes a lens 40. The lens 40 is disposed to face the end surface 12c of the mesa portion 12 that is a light incident surface, and converges the detection light DL toward the end surface 12c to condense the detection light DL on the end surface 12c. A numerical aperture (NA) of the lens 40 is, for example, 0.4 or more, and a condensed light diameter is several μm to several tens of μm. A low reflection layer including a dielectric multilayer film may be formed on both surfaces of the lens 40 and the end surface 12c. In this case, a transmittance of these surfaces for light in a sensitivity wavelength range of the photodetector can be 95% or more.

Functions and Effects

In the photodetection module 1, the first electrode 15 on the semiconductor substrate 11 in the photodetector 10 is electrically connected to the first wiring 52 in a state where the first electrode 15 is in surface contact with the first wiring 52 on the insulating substrate 51 in the fixing member 50 (surface-to-surface connected). Accordingly, for example, compared to when the first electrode 15 and the first wiring 52 are connected to each other by wire bonding, the generation of inductance caused by wires can be avoided, and inductance can be reduced. As a result, the response speed can be increased. In addition, since the first electrode 15 and the first wiring 52 are connected to each other in a surface contact state, the photodetector 10 and the fixing member 50 can be firmly fixed, and reliability can be ensured. Further, in the photodetection module 1, at least a part of the mesa portion 12 of the photodetector 10 is disposed inside the recessed portion 54 formed in the insulating substrate 51. Accordingly, the mesa portion 12 that is delicate can be protected, and reliability can be ensured. For example, the mesa portion 12 can be protected from damage caused by external contact, the attachment of floating matter, air pressure, or the like (mechanical damage caused by external factors). Therefore, according to the photodetection module 1, increasing response speed and ensuring reliability can be realized.

Figure 10:
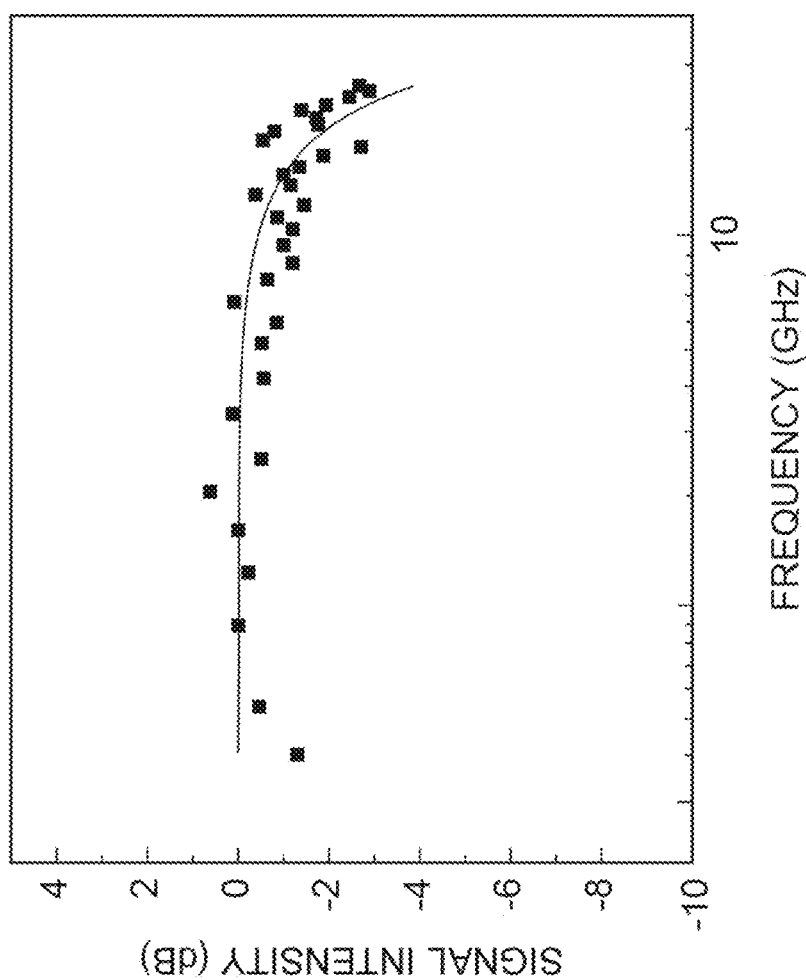
FIG. 10 is a graph showing a response characteristic of the photodetector.
Figure 11:
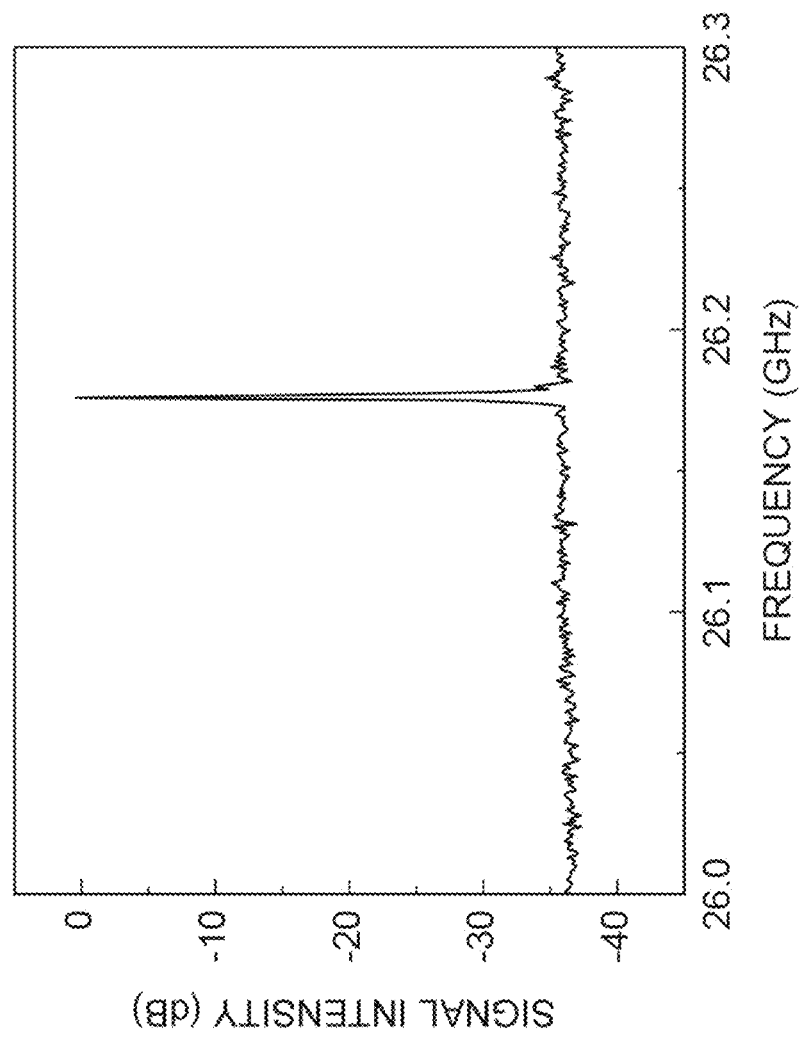
FIG. 11 is a graph showing an example of an output signal n a high frequency region.

FIG. 10 is a graph showing a response characteristic of the photodetector 10, and FIG. 11 is a graph showing an example of an output signal in a high frequency region. As shown in FIG. 10, in the photodetector 10, a cutoff frequency that is a frequency when signal intensity decreases to −3 dB is 20 GHz or higher. For example, in an MCT (HgCdTe) sensor used as a mid-infrared photodetector, only a cutoff frequency of approximately several hundreds of MHz (approximately 1 GHz at its maximum) can be realized. In contrast, in the photodetector 10, the cutoff frequency can be increased, and the response speed can be increased. In addition, as shown in FIG. 11, a high signal intensity higher than 30 dB is obtained in a frequency band higher than 26 GHz.

The mesa portion 12 includes the active layer 21 in which the absorption regions 22 that absorb the detection light through intersubband absorption and the transport regions 23 that transport electrons excited by the intersubband absorption are alternately stacked. When the mesa portion 12 includes the active layer 21 as described above, from the viewpoint of increasing response speed, reducing inductance is particularly important. In this respect, in the photodetection module 1, as described above, inductance can be reduced, and increasing response speed can be realized.

The one end surface 12c of the mesa portion 12 in the Y direction (direction parallel to the major surface 11a of the semiconductor substrate 11) (optical waveguide direction A) is an incident surface of the detection light DL. Accordingly, light can be effectively absorbed in the mesa portion 12, and output signal intensity can be ensured.

The one end surface 12c of the mesa portion 12 in the Y direction is flush with the side surface 11b of the semiconductor substrate 11. Accordingly, the end surface 12c of the mesa portion 12 can be easily used as an incident surface of the detection light DL.

The photodetection module 1 includes the lens 40 that is disposed to face the end surface 12c of the mesa portion 12, and that converges the detection light DL toward the end surface 12c of the mesa portion 12. Accordingly, a width (length in the X direction) of the end surface 12c of the mesa portion 12 can be narrowed, and the area of the mesa portion 12 in a plan view can be reduced. As a result, parasitic capacitance can be reduced, and the response speed can be further increased. In addition, when the area of the mesa portion 12 is assumed to be constant, the length of the mesa portion 12 in the optical waveguide direction A can be lengthened by narrowing the width of the mesa portion 12. As a result, light can be more effectively absorbed in the mesa portion 12, and output signal intensity can be certainly ensured. Even when the active layer 21 is thickened, absorption efficiency can be increased by increasing the number of cycles of the unit stacked bodies 24 in the active layer 21. An increase in the thickness of the active layer 21 contributes to reducing parasitic capacitance and also to reducing noise through an increase in element resistance. On the other hand, when the number of cycles is too large, quantum efficiency decreases, so that it is preferable that the number of cycles is approximately 10 to 150.

The recessed portion 54 is open on the side surface 51c of the insulating substrate 51. Accordingly, the detection light can be easily incident on the end surface 12c of the mesa portion 12 in the Y direction.

The photodetector 10 includes the air bridge wiring 16 (connection wiring) that is electrically connected to the first electrode 15 and to the first contact layer 13, and a part of the air bridge wiring 16 is disposed inside the recessed portion 54. Accordingly, the air bridge wiring 16 that is delicate can be protected, and reliability can be certainly ensured.

The second electrode 17 is electrically connected to the second wiring 53 in a state where the second electrode 17 is in surface contact with the second wiring 53 (surface-to-surface connected). Accordingly, for example, compared to when the second electrode 17 and the second wiring 53 are connected to each other by wire bonding, inductance can be reduced, and the response speed can be further increased. In addition, since the second electrode 17 and the second wiring 53 are connected to each other in a surface contact state, the photodetector 10 and the fixing member 50 can be firmly fixed, and reliability can be certainly ensured.

In a plan view, the second contact layer 14 includes the first portion 14a located between the major surface 11a of the semiconductor substrate 11 and the mesa portion 12, and the second portion 14b located outside the mesa portion 12, and the second electrode 17 is formed on the second portion 14b. Accordingly, a large area of the second electrode 17 can be ensured, and a large contact area between the second electrode 17 and the second wiring 53 can be ensured.

The first electrode 15 is in surface contact with the first wiring 52 with the solder layer 55 interposed therebetween, and the second electrode 17 is in surface contact with the second wiring 53 with the solder layer 56 interposed therebetween. Accordingly, the first electrode 15 and the first wiring 52 can be electrically and mechanically firmly connected to each other, and the second electrode 17 and the second wiring 53 can be electrically and mechanically firmly connected to each other. In addition, when the first electrode 15 and the first wiring 52 are connected to each other and the second electrode 17 and the second wiring 53 are connected to each other, even in a case where there is a height difference between the first electrode 15 and the second electrode 17, the height difference can be absorbed by the solder layers 55 and 56, and good surface contact at each connection location can be realized.

The first wiring 52 has a length of ¼ or less of a wavelength of an electrical signal propagating through the first wiring 52. Accordingly, impedance matching can be realized.

The side surfaces 12a of the mesa portion 12 in the X direction are exposed. Accordingly, the generation of parasitic capacitance can be suppressed, and the response speed can be further increased. Hereinafter, this point will be described with reference to FIG. 12.

Figure 12A:
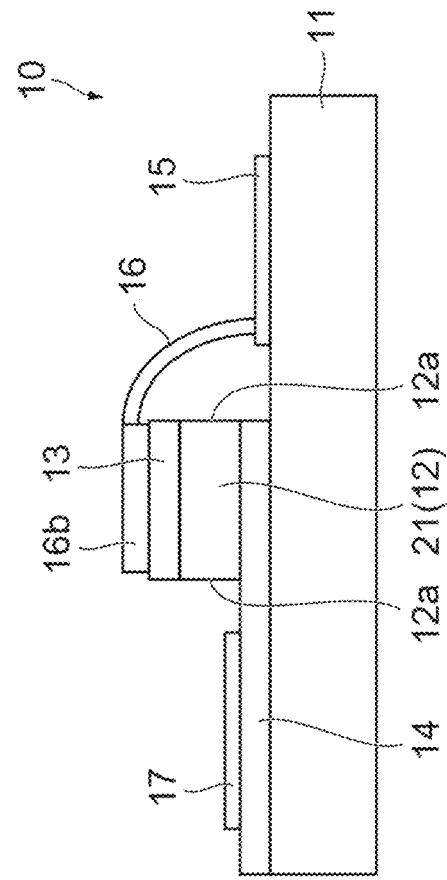
FIG. 12A is a front view of the photodetector of the embodiment.
Figure 12B:
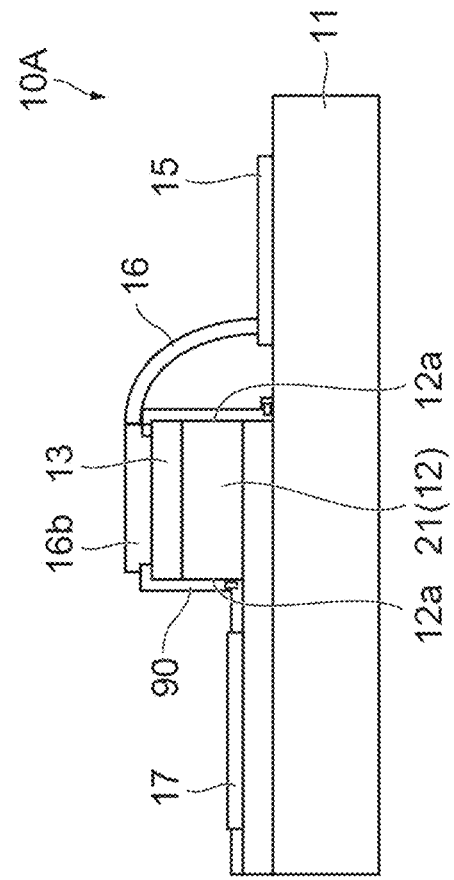
FIG. 12B is a front view of a photodetector of a first modification example.

FIG. 12(a) is a front view of the photodetector 10, and FIG. 12(b) is a front view of a photodetector 10A of a first modification example. As shown in FIG. 12(a), in the photodetector 10, both the side surfaces 12a of the mesa portion 12 in the X direction are exposed. In contrast, as shown in FIG. 12(b), in the photodetector 10A, both the side surfaces 12a of the mesa portion 12 are covered with an insulating layer 90. The insulating layer 90 is, for example, a silicon nitride (SiN) film. The insulating layer 90 is inserted between the first contact layer 13 and a metal layer (the portion 16b of the air bridge wiring 16) on the first contact layer 13. Since the portion has a structure where an insulator is sandwiched between metals, for example, when misalignment occurs during formation of the insulating layer 90, there is a possibility that a small parasitic capacitance is generated in the portion. In this respect, in the photodetector 10, since both the side surfaces 12a of the mesa portion 12 are exposed, the generation of such parasitic capacitance can be suppressed.

The mesa portion 12 is separated from the inner surface of the recessed portion 54. Accordingly, the mesa portion 12 can be certainly protected. When the photodetector 10 is a detector that detects the detection light DL using intersubband absorption in the quantum well structure, detection can be performed without applying an external voltage, so that heat is unlikely to be generated in the mesa portion 12. For this reason, the mesa portion 12 can be separated from the insulating substrate 51.

In the photodetector 10, the first contact layer 13 and the first electrode 15 are connected to each other by the air bridge wiring 16. Accordingly, for example, compared to when the first contact layer 13 and the first electrode 15 are connected to each other by wire bonding, a wiring length can be shortened, and an area of the mesa portion 12 in a plan view can be reduced. In the case of wire bonding, an area required for a wiring is determined from an area required for crimping a tip of a wire, and for example, an area of approximately 100 μm×100 μm is required. Inductance can be reduced by shortening the wiring length, and response speed can be increased. In addition, parasitic capacitance can be reduced by reducing the area of the mesa portion 12, and thus the response speed can also be increased. On the other hand, when the area of the mesa portion 12 is simply reduced, it is concerned that output signal intensity decreases. In this respect, in the photodetector 10, when viewed in the Z direction (direction perpendicular to the major surface 11a of the semiconductor substrate 11), the length L1 of the mesa portion 12 in the optical waveguide direction A (Y direction) is longer than the length L2 of the mesa portion 12 in the X direction (direction perpendicular to the optical waveguide direction A). Accordingly, a path along which the detection light DL travels through the mesa portion 12 can be lengthened, and light can be effectively absorbed in the mesa portion 12. As a result, even when the area of the mesa portion 12 is reduced, output signal intensity can be ensured. Further, in the photodetector 10, the air bridge wiring 16 is led out from the first contact layer 13 to the one side in the X direction, and is bridged between the first contact layer 13 and the first electrode 15. Accordingly, a width (length in the optical waveguide direction A) of the air bridge wiring 16 can be ensured. When the wiring width is wide, a cross-sectional area increases, so that inductance can be further reduced and strength of the air bridge wiring 16 can be ensured to ensure reliability.

The first electrode 15 includes the connection portion 15a located on the one side in the X direction with respect to the mesa portion 12, and the air bridge wiring 16 is led out from the first contact layer 13 to the one side in the X direction and is connected to the connection portion 15a of the first electrode 15. Accordingly, the air bridge wiring 16 can be led out from the first contact layer 13 to the one side in the X direction, and the width of the air bridge wiring 16 can be certainly ensured.

The air bridge wiring 16 includes the bridge portion 16a extending in air, and the length L3 of the bridge portion 16a in the optical waveguide direction A is longer than the length L4 of the bridge portion 16a in the X direction. Accordingly, the width of the bridge portion 16a (air bridge wiring 16) can be certainly ensured.

Each of the length L1 of the mesa portion 12 in the optical waveguide direction A and the length L3 of the bridge portion 16a in the optical waveguide direction A is 50 μm or more. Accordingly, the width of the bridge portion 16a can be certainly ensured. In addition, the length of the mesa portion 12 in the optical waveguide direction A can be ensured, and light can be more effectively absorbed in the mesa portion 12.

MODIFICATION EXAMPLES

Figure 13:
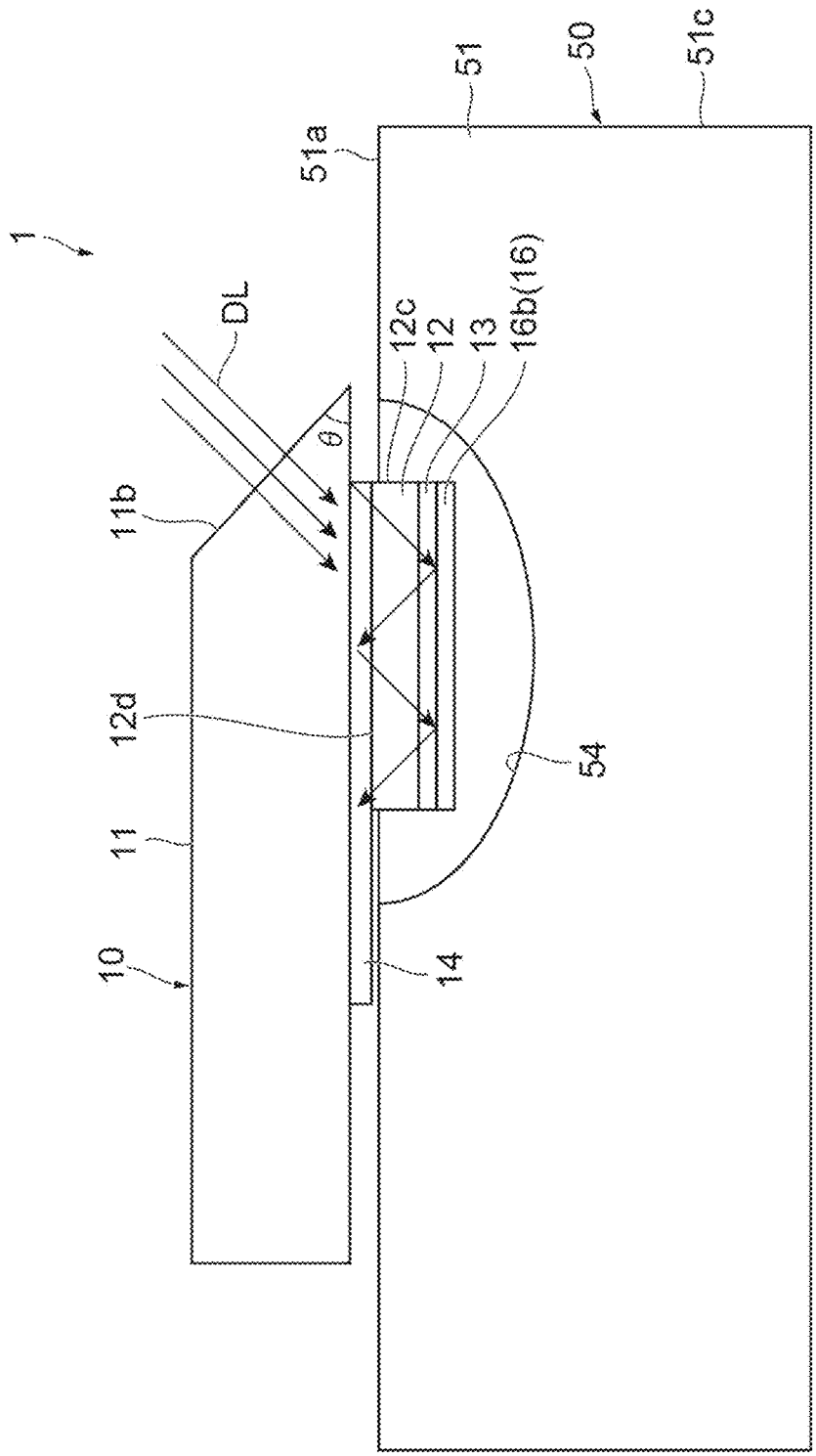
FIG. 13 is a cross-sectional view of a photodetection module according to a second modification example.
Figure 14:
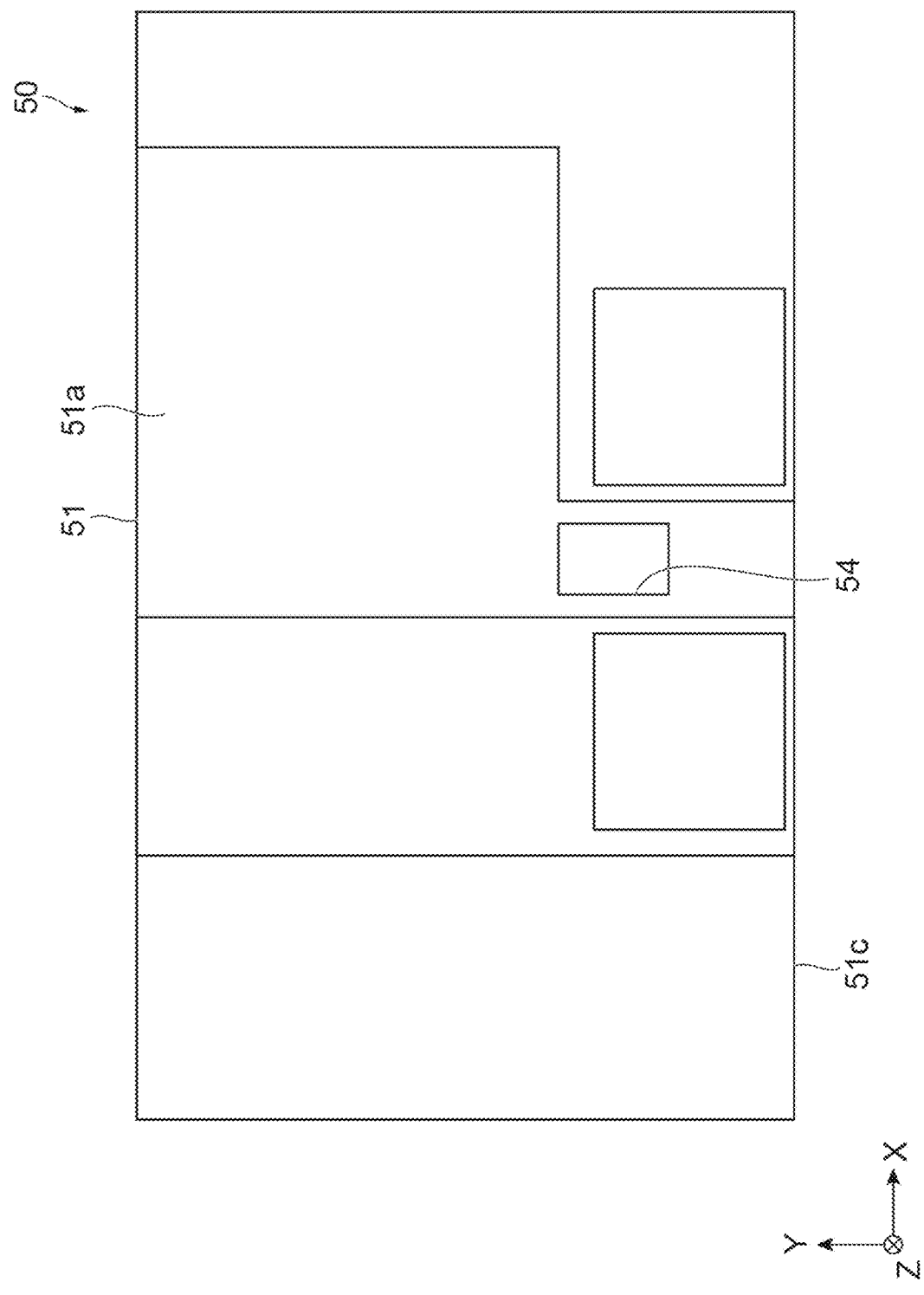
FIG. 14 is a plan view of a fixing member according to the second modification example.

In the photodetection module 1 of a second modification example shown in FIGS. 13 and 14, the detection light DL travels through the semiconductor substrate 11, and then is incident on the mesa portion 12. In the second modification example, the side surface 11b of the semiconductor substrate 11 is an inclined surface inclined with respect to the Z direction. As one example, an inclination angle θ of the side surface 11b with respect to the Z direction when viewed in the X direction is 45 degrees. The side surface 11b is a polished surface formed, for example, by polishing. The detection light DL is incident on the side surface 11b in a direction perpendicular to the side surface 11b, travels through the semiconductor substrate 11, and then is incident on a surface 12d of the mesa portion 12 through the second contact layer 14. The surface 12d is a surface on a semiconductor substrate 11 side of the mesa portion 12. Namely, in this example, the side surface 11b is an incident surface of the detection light DL. The end surface 12c of the mesa portion 12 is not flush with the side surface 11b of the semiconductor substrate 11. The detection light DL incident on the mesa portion 12 is multiply reflected inside the mesa portion 12, and an electric field vibrational component of the detection light DL that is parallel to the Z direction is absorbed in the active layer 21. The detection light DL may be multiply reflected inside the semiconductor substrate 11, and incident on the surface 12d of the mesa portion 12 a plurality of times. Incidentally, in FIG. 13, the first electrode 15 and the like are omitted and hatching indicating a cross section is omitted.

As shown in FIG. 14, in the second modification example, the recessed portion 54 is configured as a hole formed in the major surface 51a of the insulating substrate 51. The recessed portion 54 is not open on the side surface 51c of the insulating substrate 51 and is separated from an outer edge of the major surface 51a. The recessed portion 54 has a substantially semicircular shape in a cross section perpendicular to the X direction. In the second modification example, at least a part of the mesa portion 12 is also disposed inside the recessed portion 54. The mesa portion 12 is formed in a shape that allows the mesa portion 12 to be disposed inside the recessed portion 54. In the second modification example as described above, similarly to the above embodiment, increasing response speed and ensuring reliability can also be realized. In addition, since the recessed portion 54 is configured as a hole that is not open in the side surface 51c of the insulating substrate 51, the mesa portion 12 can be more certainly protected.

Figure 15:
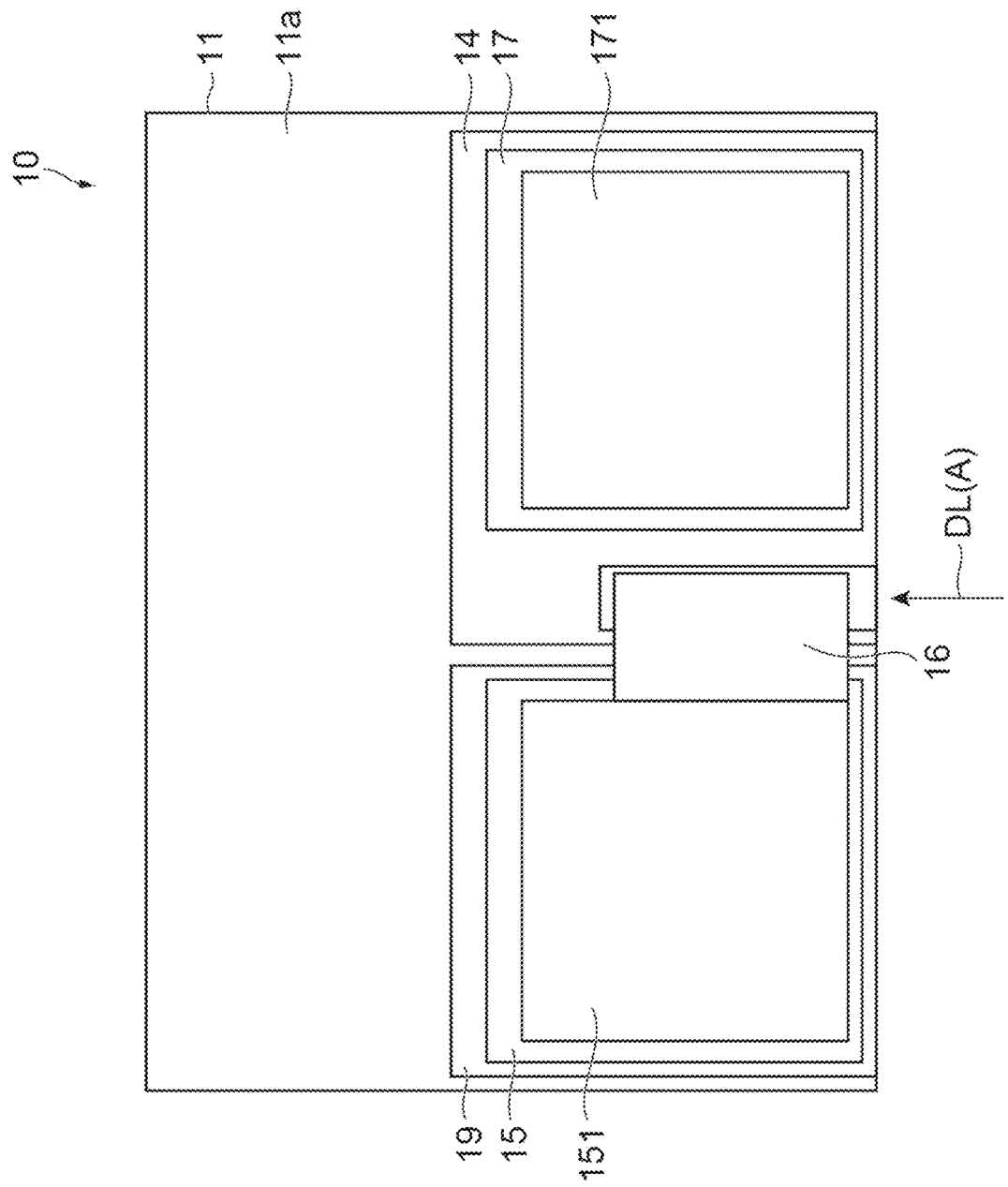
FIG. 15 is a plan view of a photodetector according to a third modification example.

In a third modification example shown in FIG. 15, the photodetector 10 includes a height adjustment layer 19. The height adjustment layer 19 is formed in a planar shape on the major surface 11a of the semiconductor substrate 11. The height adjustment layer 19 is formed on the major surface 11a to be separated from the second contact layer 14, and is electrically isolated from the second contact layer 14. The height adjustment layer 19 is formed simultaneously with the formation of the second contact layer 14, and has the same configuration as that of the second contact layer 14. Namely, the height adjustment layer 19 has the same thickness as that of the second contact layer 14. The first electrode 15 is formed on the height adjustment layer 19. In the third modification example as described above, similarly to the above embodiment, increasing response speed and ensuring reliability can also be realized. In addition, when the first electrode 15 and the first wiring 52 are connected to each other and the second electrode 17 and the second wiring 53 are connected to each other, even in a case where there is a height difference between the first electrode 15 and the second electrode 17, the height difference between the first electrode 15 and the second electrode 17 can be reduced by the height adjustment layer 19, and good surface contact at each connection location can be realized.

The present invention is not limited to the above embodiment. For example, the material and the shape of each configuration are not limited to the material and the shape described above, and various materials and shapes can be adopted. The length L3 of the bridge portion 16a in the optical waveguide direction A may not necessarily be longer than the length L4 of the bridge portion 16a in the X direction. The lens 40 may be omitted. The second contact layer 14 may include only the first portion 14a without including the second portion 14b. The mesa portion 12 may further include an upper cladding layer disposed between the active layer 21 and the first contact layer 13, and a lower cladding layer disposed between the active layer 21 and the second contact layer 14.

The mesa portion 12 may not be formed long in the Y direction, and may have, for example, a square shape, a circular shape, or the like in a plan view. The entirety of the mesa portion 12 may be disposed inside the recessed portion 54. The entirety of the air bridge wiring 16 (connection wiring) may be disposed inside the recessed portion 54. The connection wiring that connects the first electrode 15 and the first contact layer 13 to each other may be bonding wires.

At least one of a pair of the first electrode 15 and the first wiring 52 and a pair of the second electrode 17 and the second wiring 53 may be connected to each other in a surface contact state. The first electrode 15 and the first wiring 52 may not be surface-to-surface connected to each other, and may be connected to each other, for example, by bonding wires. The second electrode 17 and the second wiring 53 may not be surface-to-surface connected to each other, and may be connected to each other, for example, by bonding wires. The first electrode 15 or the second electrode 17 may be formed on a surface on an opposite side of the semiconductor substrate 11 from the major surface 11a. The solder layers 55 and 56 may be omitted. Namely, the first electrode 15 may be in surface contact with the first wiring 52 with a solder layer, a plating layer, or the like interposed therebetween, or may be in direct surface contact with the first wiring 52. Similarly, the second electrode 17 may be in surface contact with the second wiring 53 with a solder layer or a plating layer interposed therebetween, or may be in direct surface contact with the second wiring 53.

In the above embodiment, the first electrode 15, the second electrode 17, the first wiring 52, and the second wiring 53 can also be regarded as a second electrode, a first electrode, a second wiring, and a first wiring, respectively. Namely, the first electrode may be connected to the second contact layer 14, and the second electrode may be connected to the first contact layer 13.

In the above embodiment, the photodetector 10 is configured as a quantum cascade detector, but the photodetector 10 may be configured as other photodetectors such as a quantum well infrared photodetector (QWIP). The quantum well infrared photodetector is an infrared photodetector that detects light using intersubband absorption in a quantum well structure. The mesa portion 12 may include a semiconductor region that generates an electrical signal according to an incident amount of the detection light DL, and may not necessarily include the active layer 21. For example, the photodetector 10 may be configured as a photodiode, and in this case, the mesa portion 12 includes a semiconductor region forming a PN junction.

[Beating Spectroscopy Device]

Figure 16:
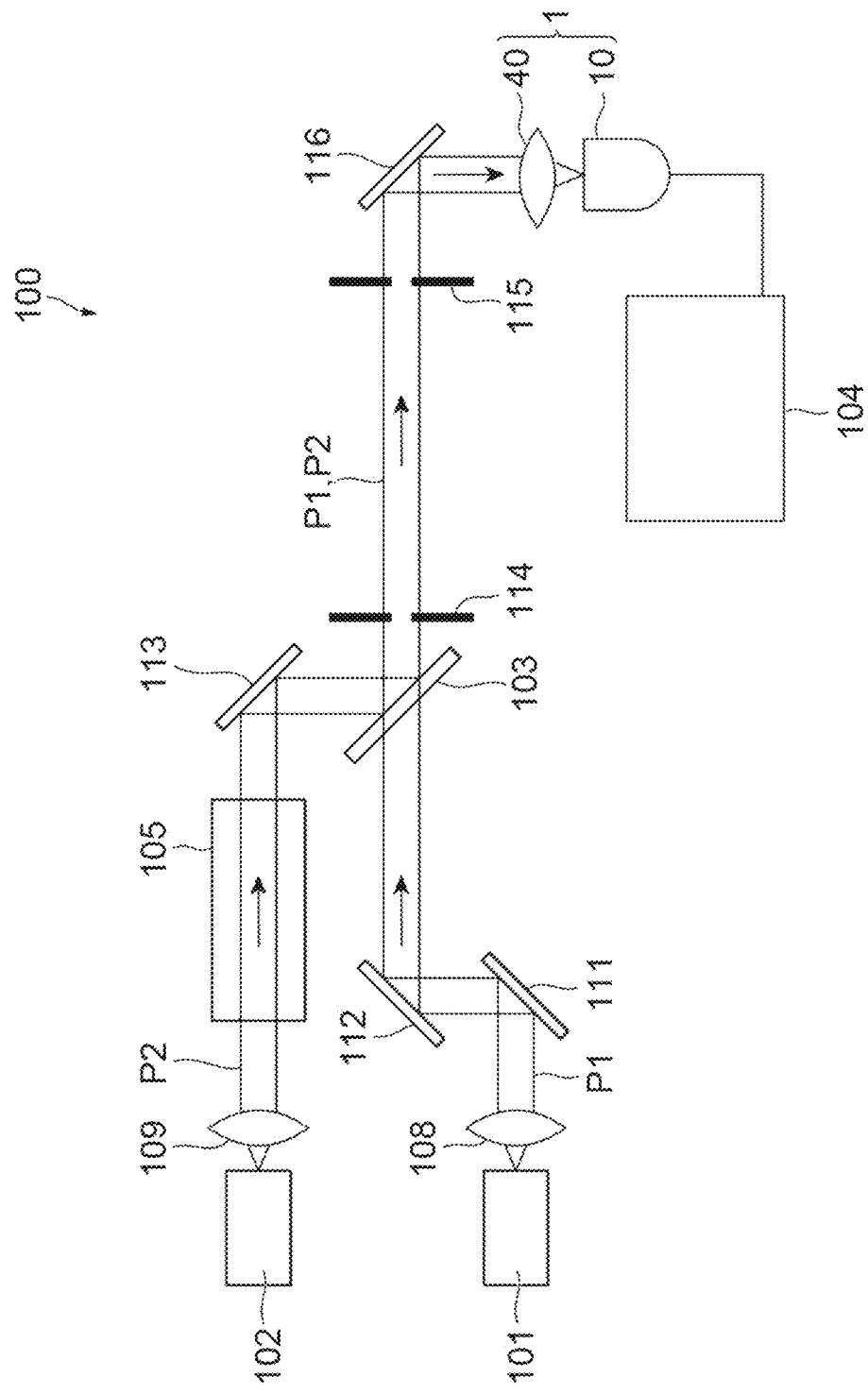
FIG. 16 is a view showing a configuration of a beating spectroscopy device.

As shown in FIG. 16, a beating spectroscopy device 100 includes a first light source (fixed wavelength light source) 101, a second light source (variable wavelength light source) 102, a beam splitter 103, the photodetection module 1, a spectrum analyzer 104, and a gas cell 105. In the beating spectroscopy device 100, light P1 from the first light source 101 and light P2 from the second light source 102 are detected by the photodetection module 1 while the wavelength of the light P2 is changed to scan a frequency of a beating signal having a frequency in accordance with a wavelength difference between the lights P1 and P2. Accordingly, heterodyne detection spectroscopy can be performed.

The first light source 101 and the second light source 102 output the lights P1 and P2 having oscillation wavelengths that are included in a sensitivity wavelength range of the photodetection module 1 and that are close to each other. The first light source 101 and the second light source 102 are, for example, distributed feedback quantum cascade lasers (DFB-QCL). During use, the oscillation wavelength of the first light source 101 is fixed and the oscillation wavelength of the second light source 102 is modulated. For example, the oscillation wavelength of the second light source 102 can be modulated by changing an injection current. Namely, the first light source 101 is a fixed wavelength light source that outputs the light P1 with a fixed wavelength, and the second light source 102 is a variable wavelength light source that outputs the light P2 with a variable wavelength. An operation of the second light source 102 is controlled by a control unit formed of, for example, a computer.

Figure 17:
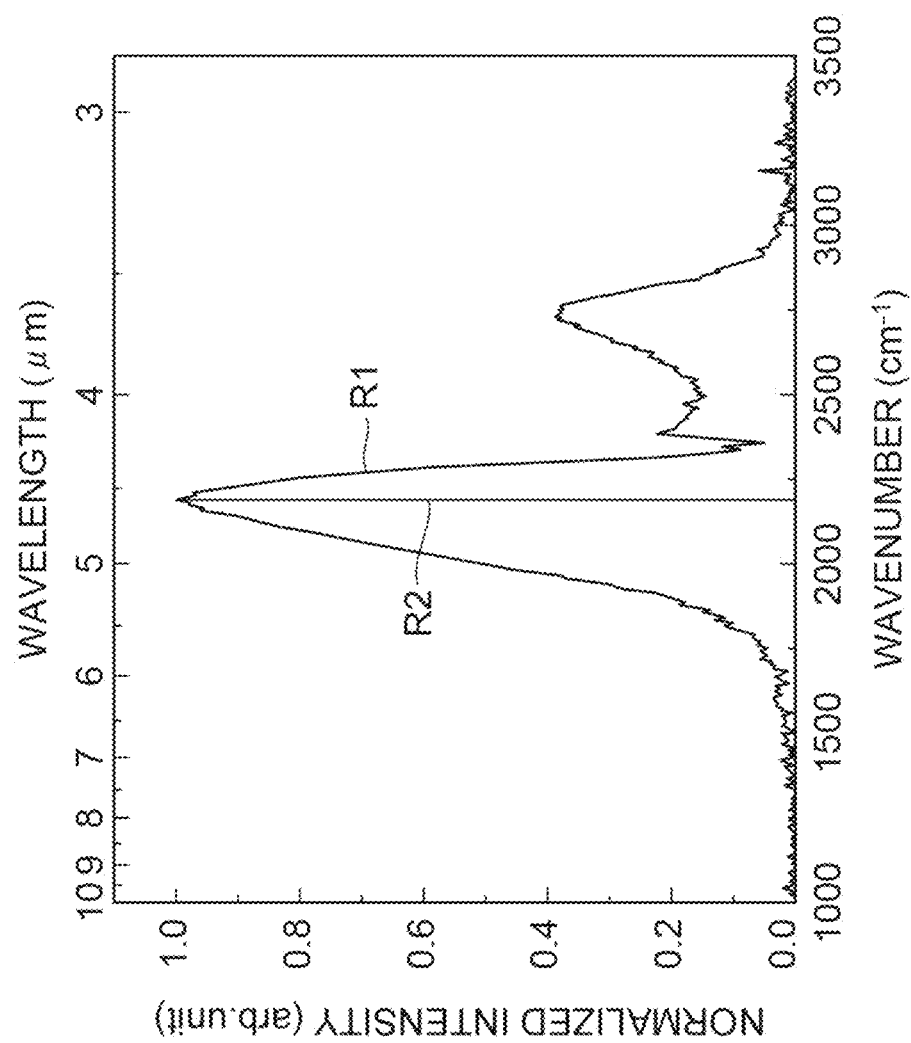
FIG. 17 is a graph showing a sensitivity characteristic of the photodetector and an oscillation wavelength of a fixed wavelength light source.
Figure 18:
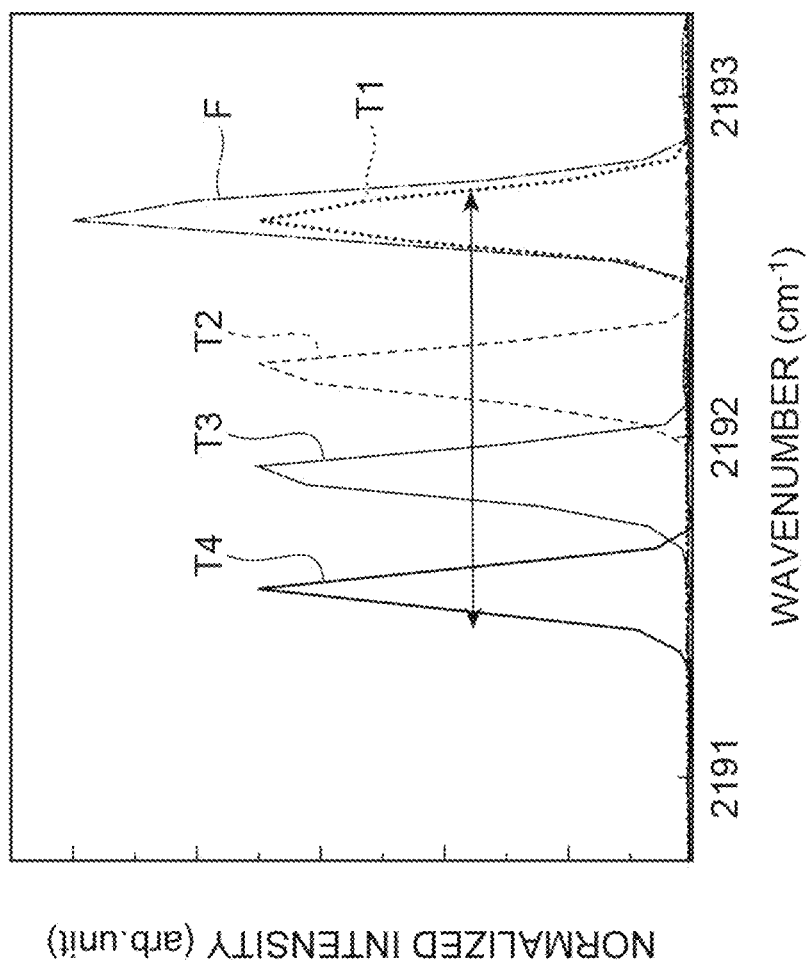
FIG. 18 is a graph showing oscillation wavelengths of the fixed wavelength light source and of a variable wavelength light source.

In FIG. 17, a sensitivity characteristic of the photodetector 10 is indicated by reference sign R1, and an oscillation wavelength of the second light source 102 is indicated by reference sign R2. As shown in FIG. 17, the oscillation wavelength of the second light source 102 is included in the sensitivity wavelength range of the photodetector 10. FIG. 18 is a graph showing oscillation wavelengths of the first light source 101 and of the second light source 102. Reference sign F indicates an oscillation wavelength of the first light source 101 when the injection current is 780 mA. Reference signs T1 to T4 indicate oscillation wavelengths of the second light source 102 when the injection currents are 780 mA, 810 mA, 830 mA, and 850 mA, respectively. In such a manner, the oscillation wavelength of the second light source 102 can be modulated by changing the injection current.

The light P1 from the first light source 101 passes through a lens 108, and then is reflected by mirrors 111 and 112 and is incident on the beam splitter 103. The light P2 from the second light source 102 passes through a lens 109, and then is reflected by a mirror 113 and is incident on the beam splitter 103. The lights P1 and P2 are combined by the beam splitter 103. The combined lights P1 and P2 pass through aperture members (irises) 114 and 115, and then are reflected by a mirror 116, are incident on the lens 40, and are incident on the photodetector 10. The spectrum analyzer 104 is connected to the photodetector 10. The gas cell 105 that contains gas to be measured is disposed between the second light source 102 and the mirror 113. The light P2 from the second light source 102 passes through in the gas cell 105, and then is incident on the mirror 113. When a wavelength modulation range of the light P2 from the second light source 102 crosses an absorption line of the gas, light of a specific wavelength of the light P2 is absorbed.

The photodetector 10 detects a beating signal (beating) having a frequency in accordance with a wavelength difference between the light P1 from the first light source 101 and the light P2 from the second light source 102. It is difficult to directly measure a frequency of light. For example, when the wavelength is 4 μm, a response speed of the photodetector needs to be approximately 75 THz or higher. In contrast, in a beating spectroscopy method using a beating signal, for example, when the wavelength of the light P1 is 4.000 μm and the wavelength of the light P2 is 4.001 μm, the response speed of the photodetector 10 may be approximately 18 GHz or higher. As described above, in the photodetection module 1, a cutoff frequency of 20 GHz or higher is obtained. For this reason, spectroscopy can be performed over a wide wavelength range by performing beating spectroscopy using the photodetection module 1.

Figure 19:
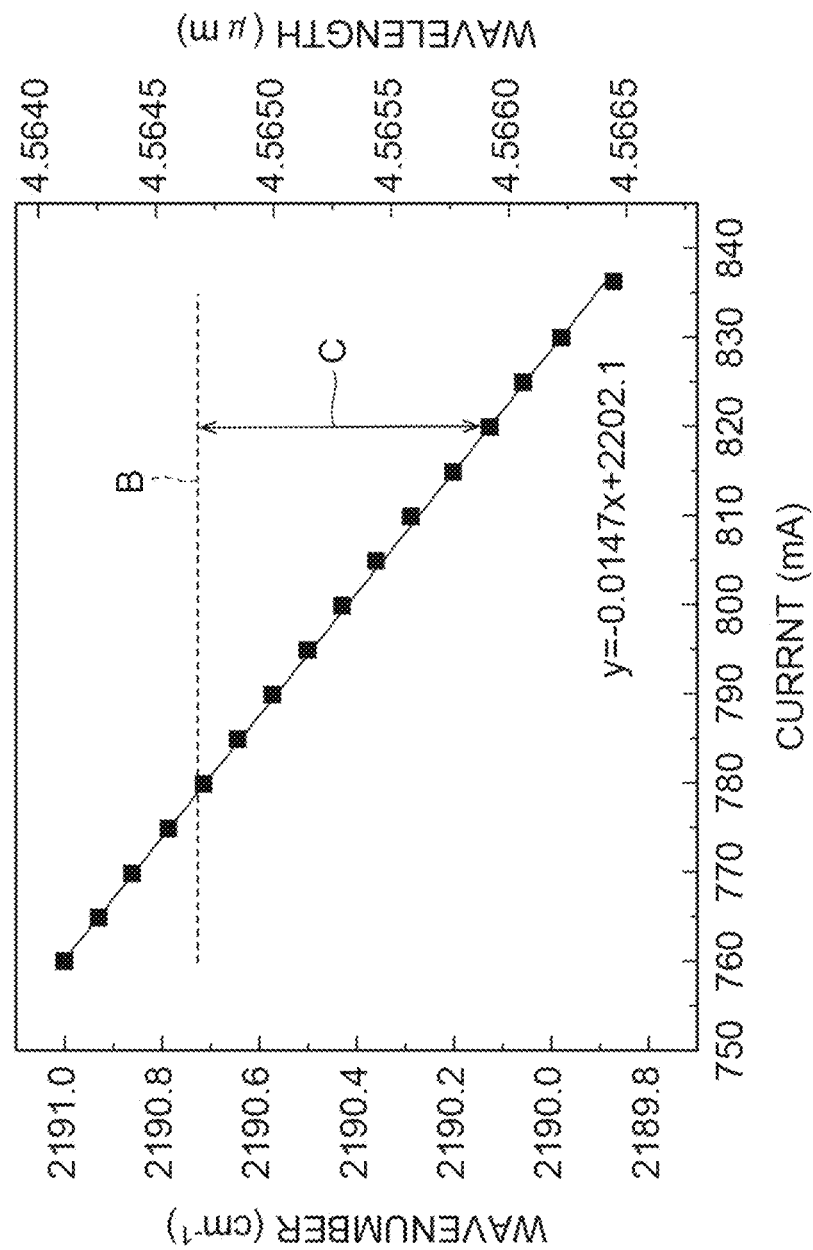
FIG. 19 is a graph showing a relationship between an injection current and an oscillation wavelength of the variable wavelength light source.
Figure 20:
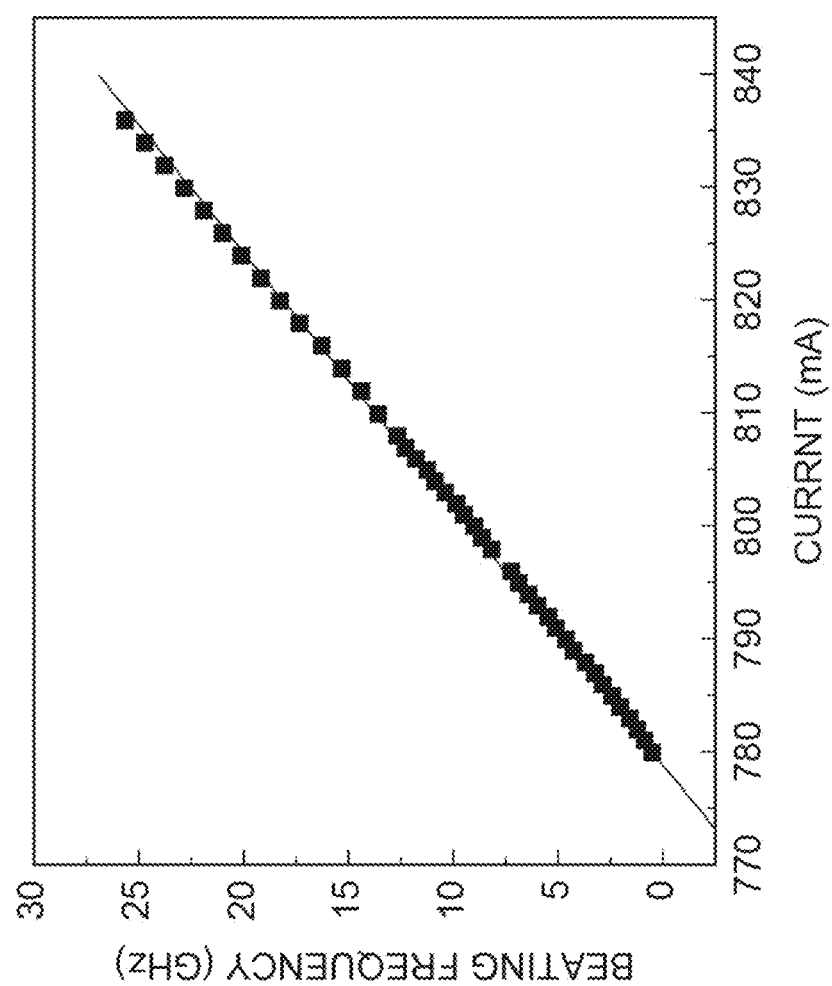
FIG. 20 is a graph showing a relationship between an injection current to the variable wavelength light source and a beating frequency.

As described above, in the beating spectroscopy device 100, the lights P1 and P2 are detected by the photodetection module 1 while the wavelength of the light P2 is changed to scan the frequency of the beating signal. FIG. 19 is a graph showing a relationship between an injection current and an oscillation wavelength of the second light source 102. As shown in FIG. 19, when a current of the second light source 102 is x and a wavenumber of the light P2 from the second light source 102 is y, a relationship of y=0.0147x+2202.1 is established. Broken line B indicates an oscillation wavelength of the first light source 101 when the injection current is 750 mA. In this example, an operating temperature of each of the first light source 101 and the second light source 102 is 20° C., and both are driven by a continuous wave (CW). Reference sign C indicates a difference in oscillation wavelength between the first light source 101 and the second light source 102 at an injection current. The faster the response speed of the photodetector 10 is, the larger the difference can be, and a wavelength scanning range can be widened. FIG. 20 is a graph showing a relationship between an injection current to the second light source 102 and a beating frequency. As shown in FIG. 20, the beating frequency increases linearly with an increase in the injection current.

Figure 21:
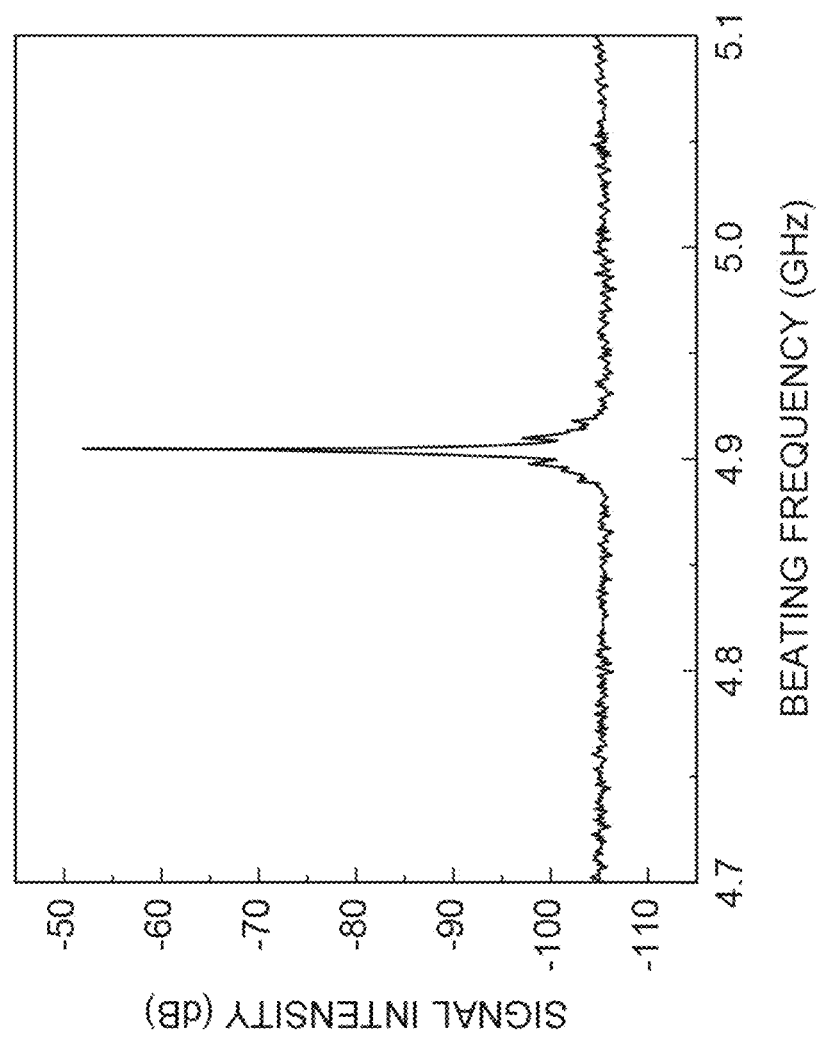
FIG. 21 is a graph showing an example of a beating signal.
Figure 22:
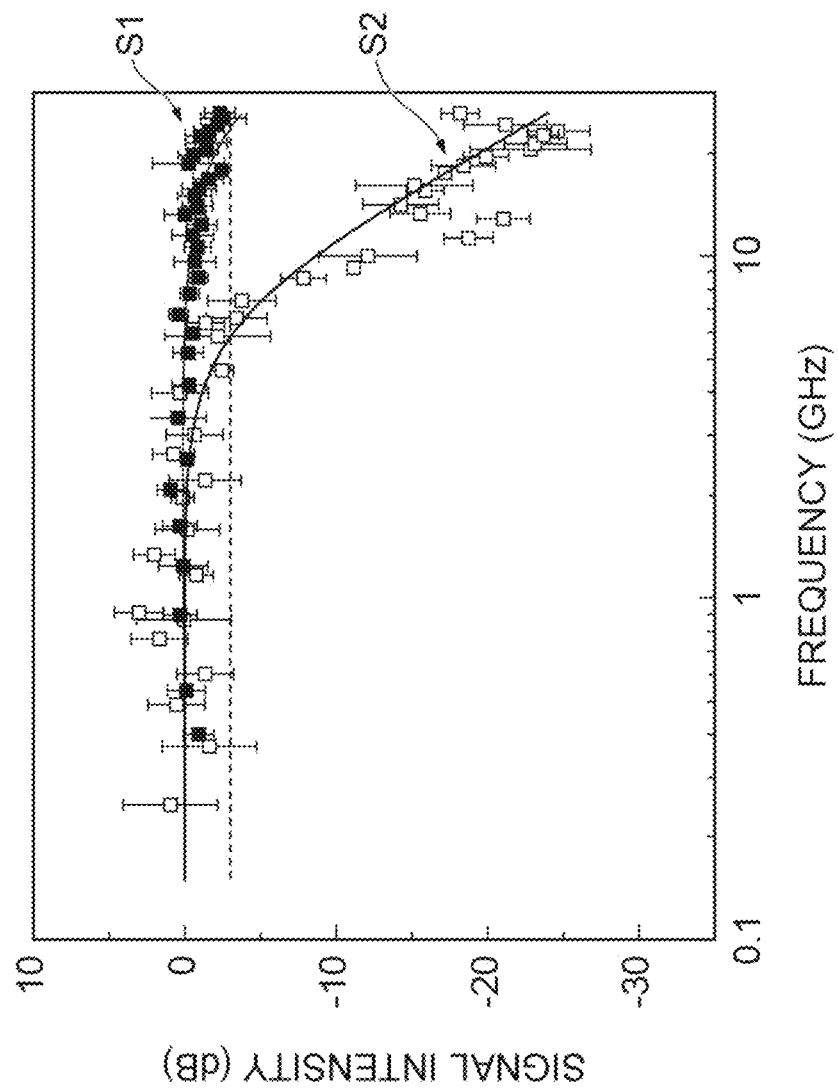
FIG. 22 is a graph showing a result of comparison of response characteristics.

FIG. 21 is a graph showing an example of a beating signal. FIG. 22 is a graph showing a result of comparison of response characteristics. In FIG. 22, reference sign S1 indicates a frequency response characteristic of the photodetection module 1, and reference sign S2 indicates a frequency response characteristic of a photodetector for comparison. It can be seen from FIG. 22 that in the photodetection module 1, the cutoff frequency is 20 GHz or higher and the response speed is increased compared to the photodetector for comparison.

Figure 23:
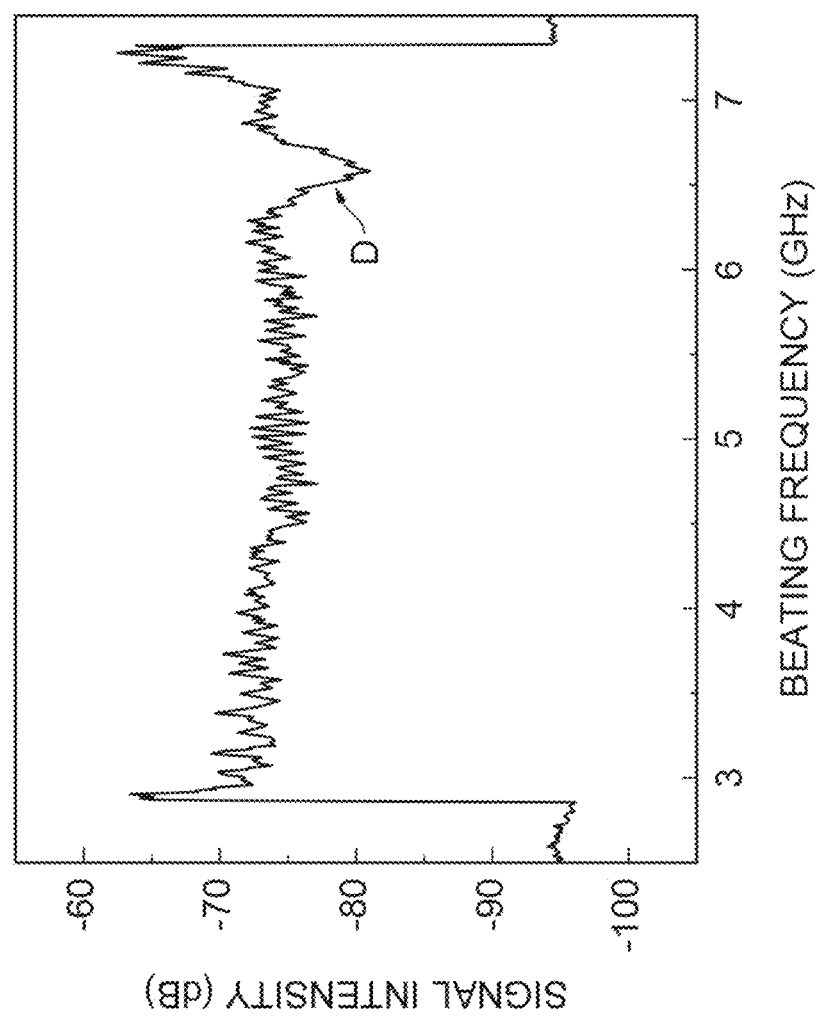
FIG. 23 is a graph showing a measurement result of beating spectroscopy.
Figure 24:
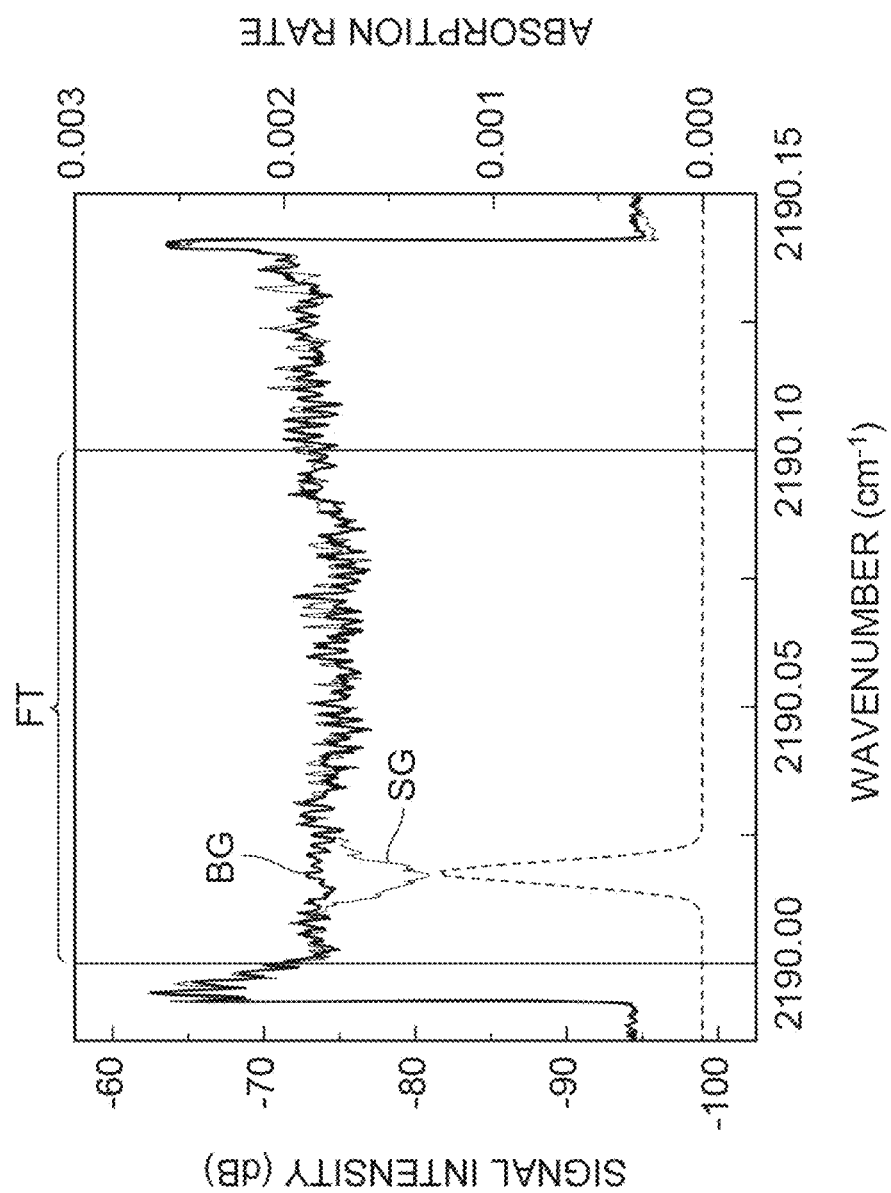
FIG. 24 is a graph showing a measurement result of beating spectroscopy.
Figure 25:
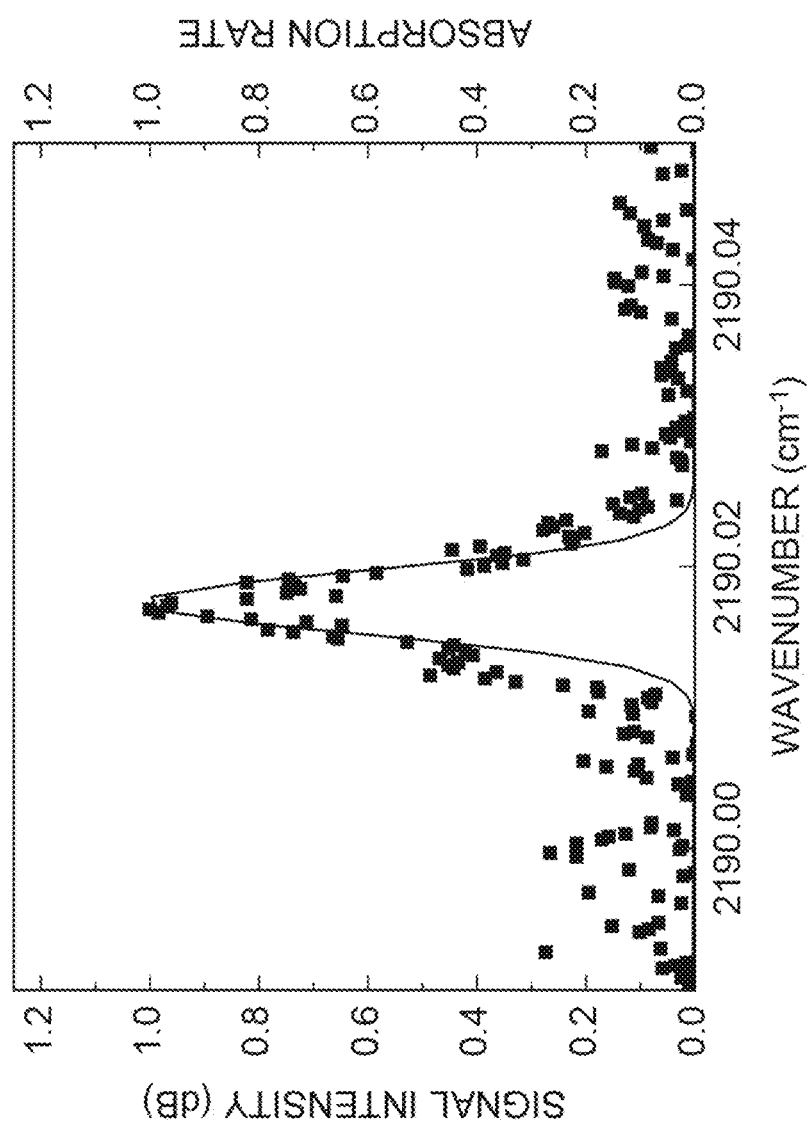
FIG. 25 is a graph showing a measurement result of beating spectroscopy.

FIGS. 23, 24, and 25 are graphs showing measurement results of beating spectroscopy. FIG. 23 is a graph showing an output signal of the spectrum analyzer 104, and FIG. 24 is a graph in which beating frequency on the horizontal axis of the graph shown in FIG. 23 is converted into wavelength. FIG. 25 is a graph obtained by subtracting a signal of background light from the output signal.

In this example, gas to be measured is carbon monoxide, and an absorption line in the vicinity of a wavenumber of 2190 $cm^{-1}$ is observed. When a wavelength scanning range crosses the absorption line of the gas to be measured, as indicated by arrow D in FIG. 23, the absorption of the gas dependent on the wavelength is observed. The reason is that when a wavelength of the light P2 from the second light source 102 coincides with an absorption wavelength of the gas, light intensity decreases due to the absorption. Intensity of the beating signal is proportional to a product of an electric field amplitude of the light P1 from the first light source 101 and an electric field amplitude of the light P2 from the second light source 102. For this reason, the intensity of the light P2 decreases, so that a dip as indicated by arrow D is observed. In FIG. 24, reference sign SG indicates an output signal when the gas cell 105 is charged with carbon monoxide, and reference sign BG indicates an output signal when there is no carbon monoxide inside the gas cell 105. In addition, an absorption spectrum of carbon monoxide is indicated by a broken line. Reference sign FT indicates one example of a resolution range of a Fourier transform infrared spectrometer (FTIR). A resolution of the FTIR is approximately 3 GHz (0.1 cm$^{-1}$), whereas a resolution of approximately 20 MHz can be obtained in the beating spectroscopy device 100. The resolution is 150 or more times the resolution of the FTIR. In such a manner, according to the beating spectroscopy device 100, the wavelength scanning range in beating spectroscopy can be widened.

In addition, in the beating spectroscopy device 100, the first light source 101 and the second light source 102 are quantum cascade lasers, and the photodetector 10 is a quantum cascade detector. Since output light of the quantum cascade laser is linearly polarized light parallel to a growth direction of the active layer, the first light source 101, the second light source 102, and the photodetector 10 are disposed such that polarization directions of the first light source 101 and of the second light source 102 coincide with a polarization direction to which the photodetector 10 is sensitive, the lights P1 and P2 from the first light source 101 and from the second light source 102 can be effectively absorbed in the active layer 21 of the photodetector 10. Further, in this case, polarization characteristics of the first light source 101 and of the second light source 102 and a polarization characteristic of the photodetector 10 function as polarization filters, so that an influence of background light having random polarization can be suppressed, and as a result, SN ratio can be improved.

REFERENCE SIGNS LIST

1: photodetection module, 10, 10A: photodetector, 11: semiconductor substrate, 11a: major surface, 11b: side surface, 12: mesa portion, 12a: side surface, 12c: end surface, 13: first contact layer, 14: second contact layer, 14a: first portion, 14b: second portion, 15: first electrode, 16: air bridge wiring (connection wiring), 17: second electrode, 19: height adjustment layer, 21: active layer, 22: absorption region, 23: transport region, 40: lens, 50: fixing member, 51: insulating substrate, 51a: major surface, 51c: side surface, 52: first wiring, 53: second wiring, 54: recessed portion, 54a: inner surface, 55, 56: solder layer, 100: beating spectroscopy device, 101: first light source (fixed wavelength light source), 102: second light source (variable wavelength light source), A: optical waveguide direction, DL: detection light, P1: light from first light source, P2: light from second light source.

The invention claimed is:

1. A photodetection module comprising:
a photodetector; and
a fixing member to which the photodetector is fixed,
wherein the photodetector includes:
a semiconductor substrate including a major surface,
a mesa portion including a semiconductor region that generates an electrical signal in accordance with an incident amount of detection light, and formed on the major surface of the semiconductor substrate,
a first contact layer formed on a surface of the mesa portion on a side opposite to the semiconductor substrate,
a second contact layer formed between the major surface of the semiconductor substrate and the mesa portion, and
a first electrode formed in a planar shape on the major surface of the semiconductor substrate, and electrically connected to one of the first contact layer and the second contact layer,
the fixing member includes:
an insulating substrate including a major surface, and
a first wiring formed in a planar shape on the major surface of the insulating substrate,
a recessed portion is formed in the major surface of the insulating substrate,
at least a part of the mesa portion is disposed inside the recessed portion, and
the first electrode is electrically connected to the first wiring in a state where the first electrode is in surface contact with the first wiring,
wherein the photodetector further includes a connection wiring electrically connected to the first electrode and the first contact layer, at least a part of the connection wiring is disposed inside the recessed portion, and
wherein the mesa portion and the connection wiring are separated from an inner surface of the recessed portion.

2. The photodetection module according to claim 1, wherein the semiconductor region of the mesa portion includes an active layer in which absorption regions that absorb the detection light through intersubband absorption and transport regions that transport electrons excited by the intersubband absorption are alternately stacked.

3. The photodetection module according to claim 1, wherein one end surface of the mesa portion in a direction parallel to the major surface of the semiconductor substrate is an incident surface of the detection light.

4. The photodetection module according to claim 1, wherein one end surface of the mesa portion in a direction parallel to the major surface of the semiconductor substrate is flush with a side surface of the semiconductor substrate.

5. The photodetection module according to claim 3, further comprising:
a lens that is disposed to face the end surface of the mesa portion, and that converges the detection light toward the end surface of the mesa portion.

6. The photodetection module according to claim 1, wherein the recessed portion is open on a side surface of the insulating substrate.

7. The photodetection module according to claim 1, wherein the recessed portion is configured as a hole formed in the major surface of the insulating substrate to be separated from an outer edge of the major surface.

8. The photodetection module according to claim 1, wherein the connection wiring is an air bridge wiring having a sheet shape.

9. The photodetection module according to claim 1, wherein the photodetector further includes a second electrode formed in a planar shape on the major surface of the semiconductor substrate, and electrically connected to the other of the first contact layer and the second contact layer,
the fixing member further includes a second wiring formed in a planar shape on the major surface of the insulating substrate, and
the second electrode is electrically connected to the second wiring in a state where the second electrode is in surface contact with the second wiring.

10. The photodetection module according to claim 9, wherein when viewed in a direction perpendicular to the major surface of the semiconductor substrate, the second contact layer includes a first portion located between the major surface of the semiconductor substrate and the mesa portion, and a second portion located outside the mesa portion, and the second electrode is formed on the second portion of the second contact layer.

11. The photodetection module according to claim 10, wherein the first electrode is in surface contact with the first wiring with a solder layer interposed therebetween, and the second electrode is in surface contact with the second wiring with a solder layer interposed therebetween.

12. The photodetection module according to claim 10, wherein the photodetector includes a height adjustment layer formed in a planar shape on the major surface of the semiconductor substrate, and electrically isolated from the second contact layer, and the first electrode is formed on the height adjustment layer.

13. The photodetection module according to claim 1, wherein the first wiring has a length of ¼ or less of a wavelength of an electrical signal that propagates through the first wiring.

14. The photodetection module according to claim 1, wherein both side surfaces of the mesa portion in a direction perpendicular to an optical waveguide direction are exposed.

15. A beating spectroscopy device comprising:
a fixed wavelength light source;
a variable wavelength light source; and
the photodetection module according to claim 1 that detects light from the fixed wavelength light source and light from the variable wavelength light source as the detection light,
wherein the light from the fixed wavelength light source and the light from the variable wavelength light source are detected by the photodetector while a wavelength of the light from the variable wavelength light source is changed to scan a frequency of a beating signal having a frequency in accordance with a wavelength difference between the light from the fixed wavelength light source and the light from the variable wavelength light source.

16. A photodetection module comprising:
a photodetector; and
a fixing member to which the photodetector is fixed,
wherein the photodetector includes:
a semiconductor substrate including a major surface,
a mesa portion including a semiconductor region that generates an electrical signal in accordance with an incident amount of detection light, and formed on the major surface of the semiconductor substrate,
a first contact layer formed on a surface of the mesa portion on a side opposite to the semiconductor substrate,
a second contact layer formed between the major surface of the semiconductor substrate and the mesa portion, and
a first electrode formed in a planar shape on the major surface of the semiconductor substrate, and electrically connected to one of the first contact layer and the second contact layer, the fixing member includes:
an insulating substrate including a major surface, and
a first wiring formed in a planar shape on the major surface of the insulating substrate,
a recessed portion is formed in the major surface of the insulating substrate,
at least a part of the mesa portion is disposed inside the recessed portion, and
the first electrode is electrically connected to the first wiring in a state where the first electrode is in surface contact with the first wiring,
wherein both side surfaces of the mesa portion in a direction perpendicular to an optical waveguide direction are exposed.

17. A beating spectroscopy device comprising:
a fixed wavelength light source;
a variable wavelength light source; and
a photodetection module that detects light from the fixed wavelength light source and light from the variable wavelength light source as detection light,
the photodetection module comprising:
a photodetector; and
a fixing member to which the photodetector is fixed,
wherein the photodetector includes:
a semiconductor substrate including a major surface,
a mesa portion including a semiconductor region that generates an electrical signal in accordance with an incident amount of the detection light, and formed on the major surface of the semiconductor substrate,
a first contact layer formed on a surface of the mesa portion on a side opposite to the semiconductor substrate,
a second contact layer formed between the major surface of the semiconductor substrate and the mesa portion, and
a first electrode formed in a planar shape on the major surface of the semiconductor substrate, and electrically connected to one of the first contact layer and the second contact layer,
the fixing member includes:
an insulating substrate including a major surface, and
a first wiring formed in a planar shape on the major surface of the insulating substrate,
a recessed portion is formed in the major surface of the insulating substrate,
at least a part of the mesa portion is disposed inside the recessed portion, and
the first electrode is electrically connected to the first wiring in a state where the first electrode is in surface contact with the first wiring,
wherein the light from the fixed wavelength light source and the light from the variable wavelength light source are detected by the photodetector while a wavelength of the light from the variable wavelength light source is changed to scan a frequency of a beating signal having a frequency in accordance with a wavelength difference between the light from the fixed wavelength light source and the light from the variable wavelength light source.

* * * * *